(12) United States Patent
Liao et al.

(10) Patent No.: US 12,283,519 B2
(45) Date of Patent: Apr. 22, 2025

(54) FORMING METHOD FOR SEMICONDUCTOR STRUCTURE AND SEMICONDUCTOR STRUCTURE

(71) Applicant: CHANGXIN MEMORY TECHNOLOGIES, INC., Anhui (CN)

(72) Inventors: Chuxian Liao, Hefei (CN); Yuhan Zhu, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 567 days.

(21) Appl. No.: 17/573,775

(22) Filed: Jan. 12, 2022

(65) Prior Publication Data
US 2022/0139763 A1    May 5, 2022

Related U.S. Application Data

(63) Continuation of application No. PCT/CN2021/095606, filed on May 24, 2021.

(30) Foreign Application Priority Data

Jul. 14, 2020    (CN) .......................... 202010674232.0

(51) Int. Cl.
| | |
|---|---|
| H01L 21/768 | (2006.01) |
| H01L 23/522 | (2006.01) |
| H01L 23/532 | (2006.01) |

(52) U.S. Cl.
CPC .... *H01L 21/7682* (2013.01); *H01L 21/76831* (2013.01); *H01L 23/5226* (2013.01); *H01L 23/5329* (2013.01)

(58) Field of Classification Search
CPC ... H01L 29/0642; H01L 29/0649–0653; H01L 29/51–515;
(Continued)

(56) References Cited

U.S. PATENT DOCUMENTS

| | | |
|---|---|---|
| 8,198,189 B2 | 6/2012 | Kim |
| 8,344,517 B2 | 1/2013 | Kim |
| (Continued) | | |

FOREIGN PATENT DOCUMENTS

| | | |
|---|---|---|
| CN | 103383935 A | 11/2013 |
| CN | 105280608 A | 1/2016 |
| (Continued) | | |

OTHER PUBLICATIONS

International Search Report in the international application No. PCT/CN2021/095606, mailed on Aug. 23, 2021, 2 pgs.
(Continued)

*Primary Examiner* — Amar Movva
*Assistant Examiner* — Eric Manuel Mulero Flores
(74) *Attorney, Agent, or Firm* — Kilpatrick Townsend & Stockton LLP

(57) ABSTRACT

A forming method for a semiconductor structure and the semiconductor structure are provided. The forming method of the semiconductor structure includes: providing a substrate, wherein separate bit line structures are formed on the substrate; forming a first sacrificial layer on a sidewall of a bit line structure; forming first dielectric layer filling gaps between adjacent bit line structures; patterning a first dielectric layer to form vias, wherein the vias expose active regions of the substrate, and the vias and remaining parts of the first dielectric layers are alternately arranged in an extension direction of the bit line structures; forming a second sacrificial layer on sidewalls of a via, and filling the via to form a contact plugs; forming a contact structure on the contact plug; and removing the first sacrificial layer to form first air gap, and removing the second sacrificial layer to form a second air gap.

9 Claims, 28 Drawing Sheets

(58) Field of Classification Search
CPC ... H01L 2221/1042–1047; H10B 12/01–0335; H10B 12/05–056; H10B 12/34–36; H10B 12/48–488
See application file for complete search history.

(56) References Cited

U.S. PATENT DOCUMENTS

| | | |
|---|---|---|
| 8,778,749 B2 | 7/2014 | Pachamuthu |
| 9,123,550 B2 | 9/2015 | Son |
| 9,508,649 B2 | 11/2016 | Lee et al. |
| 9,520,348 B2 | 12/2016 | Choi |
| 9,627,253 B2 | 4/2017 | Kim |
| 9,786,598 B2 | 10/2017 | Kim et al. |
| 10,468,350 B2 | 11/2019 | Kim et al. |
| 10,490,444 B2 | 11/2019 | Choi et al. |
| 10,535,605 B2 | 1/2020 | Kim et al. |
| 10,607,996 B1 | 3/2020 | Sasaki |
| 10,978,397 B2 | 4/2021 | Kim et al. |
| 2010/0285662 A1 | 11/2010 | Kim |
| 2012/0178235 A1 | 7/2012 | Pachamuthu |
| 2012/0217631 A1 | 8/2012 | Kim |
| 2013/0292847 A1 | 11/2013 | Choi |
| 2014/0077333 A1 | 3/2014 | Son |
| 2016/0027727 A1* | 1/2016 | Kim .................. H10B 12/34 257/774 |
| 2016/0211215 A1* | 7/2016 | Lee .................. H01L 23/5222 |
| 2016/0247711 A1* | 8/2016 | Kim .................. H01L 23/5329 |
| 2017/0076974 A1* | 3/2017 | Choi .................. H01L 23/528 |
| 2018/0040560 A1 | 2/2018 | Kim et al. |
| 2018/0040561 A1* | 2/2018 | Kim .................. H01L 23/5226 |
| 2020/0013668 A1 | 1/2020 | Choi et al. |
| 2020/0118929 A1 | 4/2020 | Kim et al. |

FOREIGN PATENT DOCUMENTS

| | | |
|---|---|---|
| CN | 106941097 A | 7/2017 |
| CN | 107706179 A | 2/2018 |
| CN | 107833872 A | 3/2018 |
| CN | 108054153 A | 5/2018 |
| CN | 108206184 A | 6/2018 |
| CN | 108777253 A | 11/2018 |
| CN | 110718550 A | 1/2020 |
| CN | 110875314 A | 3/2020 |

OTHER PUBLICATIONS

International Search Report in the international application No. PCT/CN2021/092896, mailed on Aug. 13, 2021, 3 pgs.

* cited by examiner

//  FORMING METHOD FOR SEMICONDUCTOR STRUCTURE AND SEMICONDUCTOR STRUCTURE

CROSS-REFERENCE TO RELATED APPLICATION

This present application is a US continuation application of International Application No. PCT/CN2021/095606, filed on May 24, 2021, which claims priority to Chinese Patent Application No. 202010674232.0, filed on Jul. 14, 2020 and entitled "FORMING METHOD FOR SEMICONDUCTOR STRUCTURE AND SEMICONDUCTOR STRUCTURE". The disclosures of International Application No. PCT/CN2021/095606 and Chinese Patent Application No. 202010674232.0 are hereby incorporated by reference in their entireties.

BACKGROUND

As the integration level of semiconductor devices increases, the distance between adjacent conductive structures decreases. For example, the distance between a bit line structure and a capacitance contact window decreases, the distance between a bit line structure and a capacitive landing pad decreases, and the distance between bit line structures decreases. As the distance between the conductive structures decreases, the parasitic capacitance between the conductive structures will increase, so that the performance of the formed semiconductor device is poor.

SUMMARY

The present disclosure relates to the field of semiconductors, and particularly relates to a forming method for a semiconductor structure and a semiconductor structure.

The embodiments of the present disclosure provide a forming method for a semiconductor structure and a semiconductor structure.

The embodiments of the present disclosure provide a forming method for a semiconductor structure. The method includes the following operations. A substrate is provided, and separate bit line structures are formed on the substrate. First sacrificial layer is formed on a sidewall of a bit line structure. First dielectric layers filling gaps between adjacent bit line structures are formed. A first dielectric layer is patterned to form vias. The vias expose active regions of the substrate, and the vias and remaining parts of the first dielectric layer are alternately arranged in an extension direction of the bit line structure. A second sacrificial layer is formed on sidewalls of a via, and the via is filled to form a contact plug. A contact structure is formed on surface of the contact plug. The first sacrificial layer is removed to form a first air gap, and the second sacrificial layer is removed to form second air gap.

The embodiments of the present disclosure further provide a semiconductor structure. The semiconductor structure includes: a substrate and separate bit line structures located on the substrate; dielectric layers and contact plugs, where, the dielectric layers and the contact plugs are located in gaps between the separate bit line structures, and the contact plugs and the dielectric layers are alternately arranged in the extension directions of the bit line structures; a contact structure located on a contact plug; a part of first air gap located between a bit line structure and dielectric layer and a part of the first air gap located between the bit line structure and the contact plug; and a second air gap surrounding the contact plug, where, a part of the second air gap is located between the bit line structure and the contact plug.

DETAILED DESCRIPTION

Figure 1:
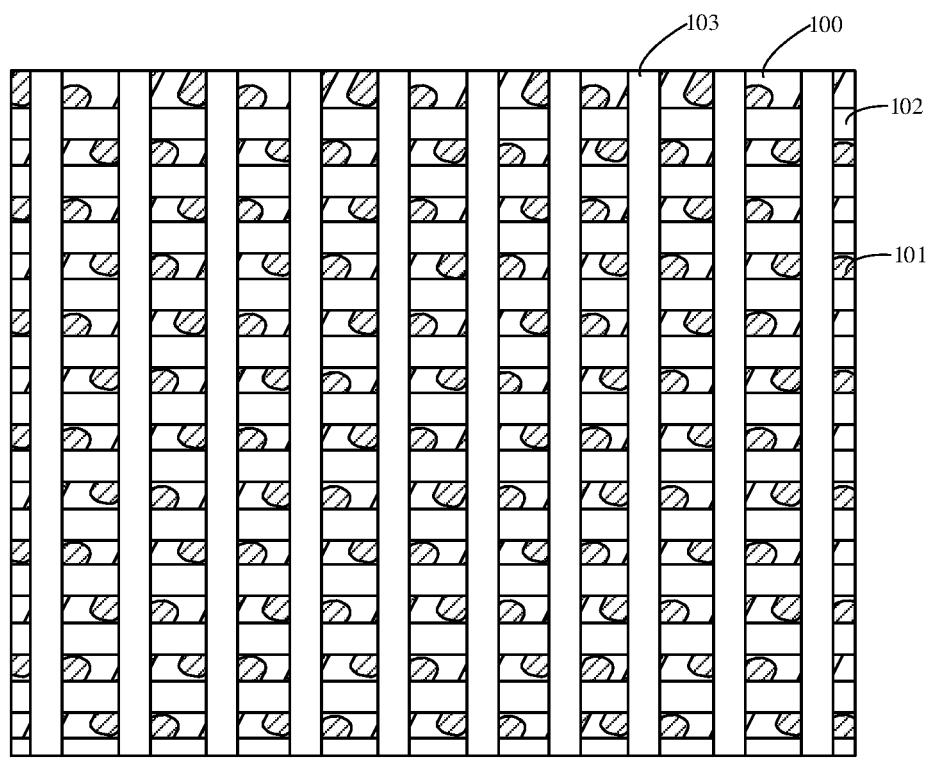
FIG. 1 to FIG. 22 are schematic structural top views and schematic cross-sectional views corresponding to each of the steps in a forming method for a semiconductor structure provided by an embodiment of the present disclosure.

The applicant found that in the manufacturing processes of related technologies, if the air gap is made too wide, the air gap is not easy to seal subsequently; and if the air gap is made too narrow, the contour uniformity of the air gap is poor, and the effect of reducing parasitic capacitance is poor.

In order to solve the above technical problem, the embodiment of the present disclosure includes the first air gap located on the sidewalls of the bit line structures and the second air gap located on the sidewalls of the contact plugs. Compared with the related technologies only forming a layer of air gap, by forming two layers of air gaps, the effect of reducing parasitic capacitance is better, and the formed air gaps are easy to seal.

In the manufacturing processes of related technologies, if the air gap is made too wide, the air gap is not easy to seal subsequently; and if the air gap is made too narrow, the contour uniformity of the air gap is poor, and the effect of reducing parasitic capacitance is poor.

In order to solve the above problems, the embodiments of the present disclosure provide a forming method for a semiconductor structure. The method includes the following operations. A substrate is provided, and separate bit line structures are formed on the substrate. A first sacrificial layer is formed on a sidewall of a bit line structure. First dielectric layers filling gaps between adjacent bit line structures are formed. A first dielectric layer is patterned to form vias. The vias expose active regions of the substrate, and the vias and remaining first dielectric layer are alternately arranged in an extension direction of the bit line structure. A second sacrificial layer is formed on sidewalls of the a via, and the via is filled to form a contact plug. A contact structure is formed on the contact plug. The first sacrificial layer is removed to form a first air gap, and the second sacrificial layer is removed to form a second air gap.

In order to make the objectives, technical solutions and advantages of the embodiments of the present disclosure clearer, the embodiments of the present disclosure will be described in detail below with reference to the accompanying drawings. However, a person of ordinary skill in the art can understand that in the embodiments of the present disclosure, many technical details are proposed for readers to better understand the present disclosure. However, even without these technical details and various changes and modifications based on the following embodiments, the technical solutions claimed in the present disclosure may also be implemented. The division of the following embodiments is for the convenience of description, and should not constitute any limitation on the specific implementation manners of the present disclosure. The embodiments may be combined and cited with each other without contradiction.

In the present disclosure, the singular forms "a/an", "one", and "the" may include the plural forms as well, unless the context clearly dictates otherwise. It should also be understood that when the terms "compose" and/or "comprise" are used in the specification, the presence of the described features, integers, steps, operations, elements and/or components may be determined, but the presence or addition of one or more other features, integers, steps, operations, elements, components and/or groups is not excluded. At the same time, when used herein, the term "and/or" includes any and all combinations of related listed items.

FIG. 1 to FIG. 22 are schematic cross-sectional views corresponding to each of the steps in a forming method for a semiconductor structure provided by the embodiments of the present disclosure. The forming method for the semiconductor structure of the embodiments will be described below.

Figure 2:
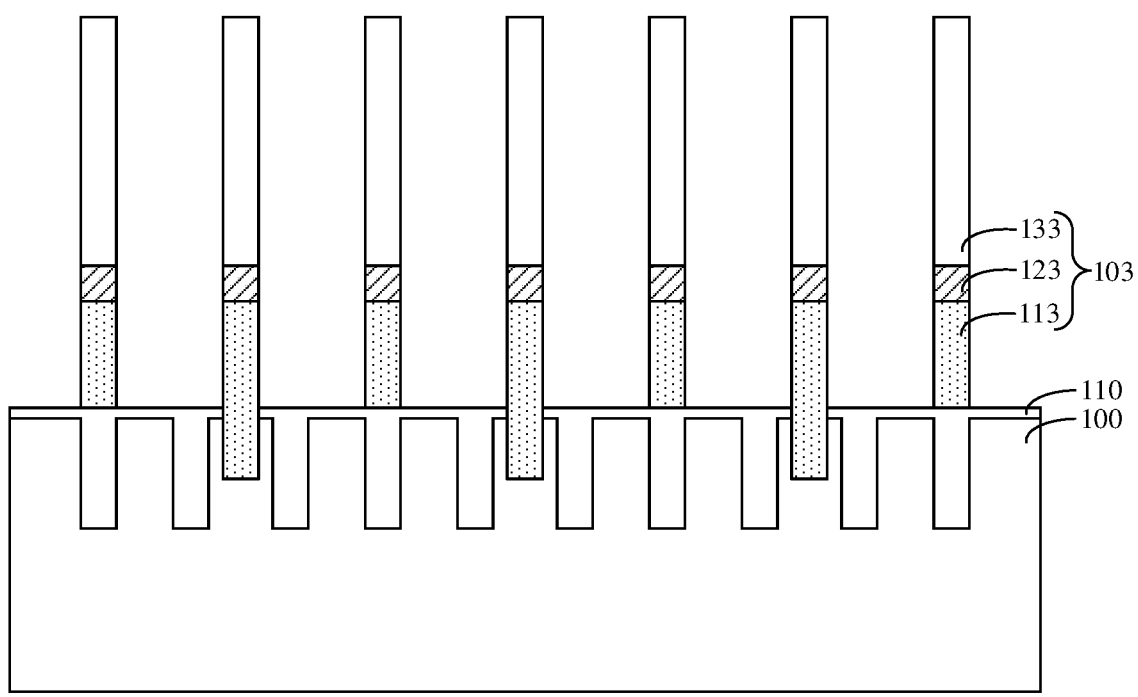

Referring to FIG. 1 and FIG. 2, a substrate 100 is provided, and separate bit line structures 103 are formed on the substrate 100.

Referring to FIG. 1, a substrate 100 including active regions 101 and word line structures 102 is provided.

A plurality of active regions 101 are arranged in parallel at intervals, the word line structure 102 and the bit line structure103 are perpendicular to each other, and a single active region 101 is intersected with two word line structures 102. It should be noted that the substrate 100 further includes other semiconductor structures in addition to the word line structure 102 and the active region 101, such as shallow trench isolation structure 110 (referring to FIG. 2), etc. Since other semiconductor structures do not involve the core technology of the present disclosure, other semiconductor structures will not be described here. Those skilled in the art can understand that the substrate 100 further includes other semiconductor structures in addition to the word line structure 102 and the active region 101 for normal operation of the semiconductor structure.

In this embodiment, the substrate 100 is made of a silicon material. It should be clear to those skilled in the art that the use of the silicon material as the substrate 100 in this embodiment is to facilitate the understanding of the subsequent forming method by those skilled in the art, and does not constitute a limitation. In a practical application process, suitable substrate materials may be selected according to requirements.

Referring to FIG. 1 and FIG. 2, separate bit line structures 103 are formed on the substrate 100.

The extension direction of the bit line structure 103 is perpendicular to the extension direction of the word line structure 102. The bit line structure 103 includes a bit line contact layer 113, a metal layer 123 and a top dielectric layer 133 which are stacked in sequence. On a cross section perpendicular to the extension direction of the bit line structure 103, only one of the two adjacent bit line structures 103 is connected to the active region 101 of the substrate 100.

The material of the bit line contact layer 113 includes silicon germanium or polysilicon. The metal layer 123 may be made of a conductive material or the metal layer 123 may be made of multiple conductive materials, such as doped polysilicon, titanium, titanium nitride, tungsten and tungsten composites. The material of the top dielectric layers 133 includes silicon nitride, silicon dioxide or silicon oxynitride. In this embodiment, the material of the top dielectric layers 133 is silicon nitride.

Figure 3:
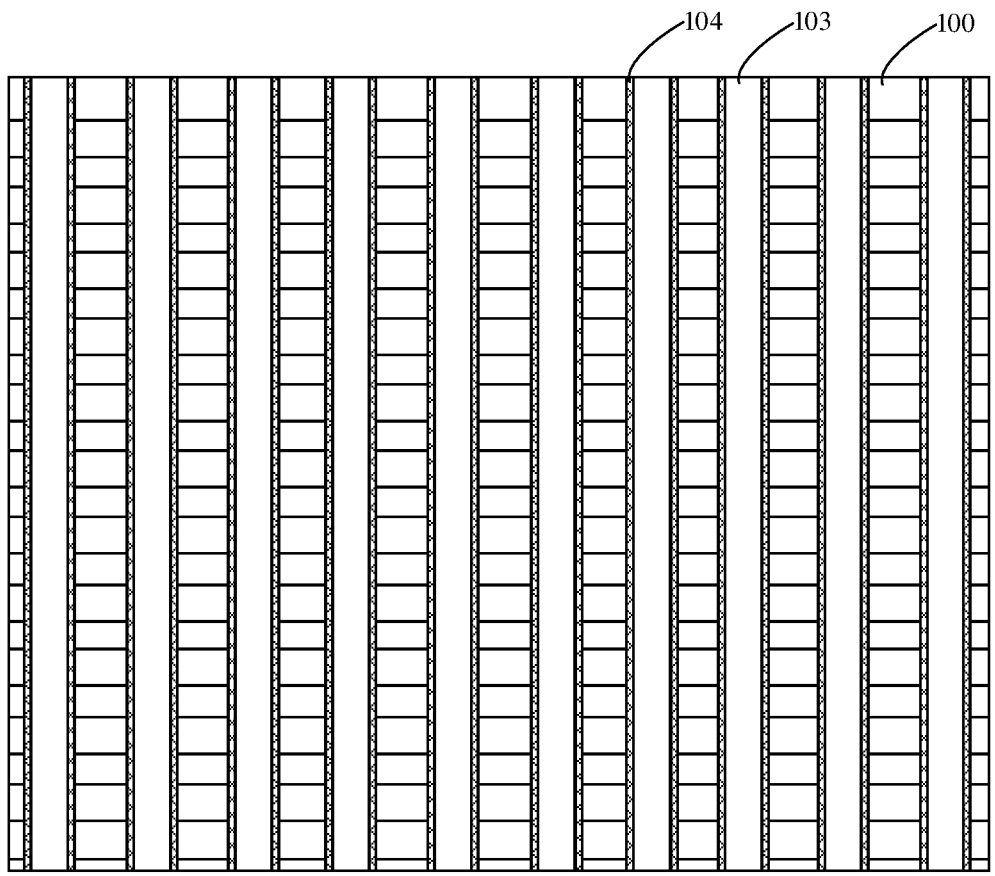
Figure 4:
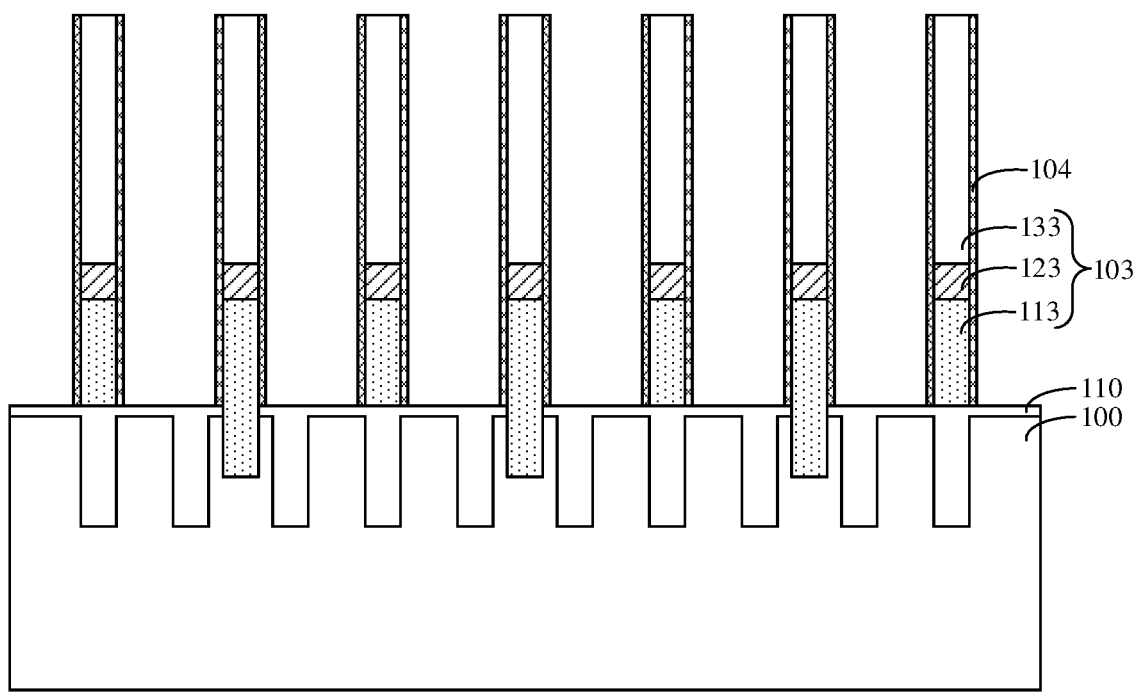

Referring to FIG. 3 and FIG. 4, a first sacrificial layer 104 is formed on each sidewall of each bit line structure 103.

The first sacrificial layer 104 is located on a sidewall of a bit line structure 103 for subsequent etching to form a first air gap located on the sidewalls of the bit line structure 103, that is, the first sacrificial layer 104 is made of a material which is easily etched.

In some embodiments, the material of the first sacrificial layer 104 is a carbon-containing material. In the subsequent process of removing the first sacrificial layer 104 to form the first air gap, the sacrificial layer may be removed by means of incineration. The incineration gas reacts with the carbon-containing material to generate carbon dioxide gas, and then, the first sacrificial layer 104 is converted into carbon dioxide gas, thereby removing the first sacrificial layer 104. Furthermore, the collapse phenomenon caused by a larger impact on the sidewalls of air isolation structures in the process of forming the air gaps is avoided. In other embodiments, the first sacrificial layer may be made of a material having a high etching selectivity for the surrounding materials, such as silicon oxide. The first sacrificial layer is removed by a wet etch process, thereby forming the first air gaps.

In this embodiment, in the direction parallel to the surface of the substrate 100, the thickness of the first sacrificial layer 104 is 0.1 nm to 5 nm, such as 0.5 nm, 1.0 nm, 1.5 nm, 2.0 nm, 2.5 nm, 3.0 nm, 3.5 nm, 4.0 nm or 4.5 nm.

Figure 5:
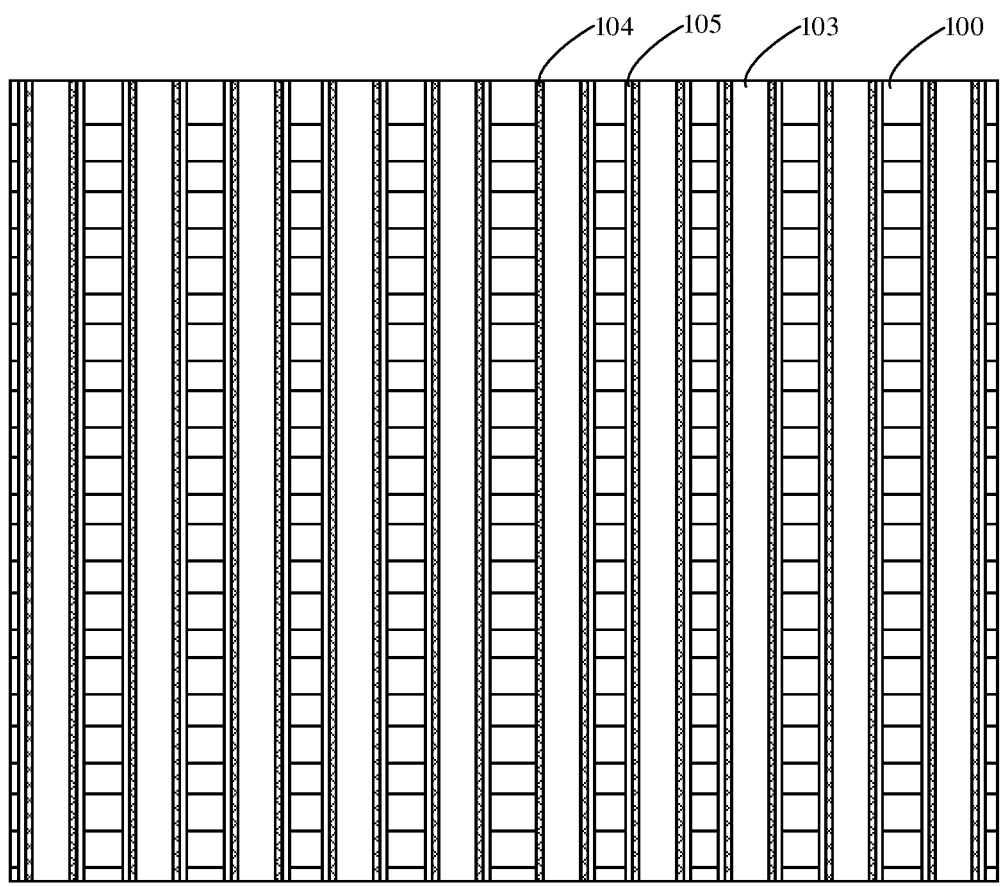
Figure 6:
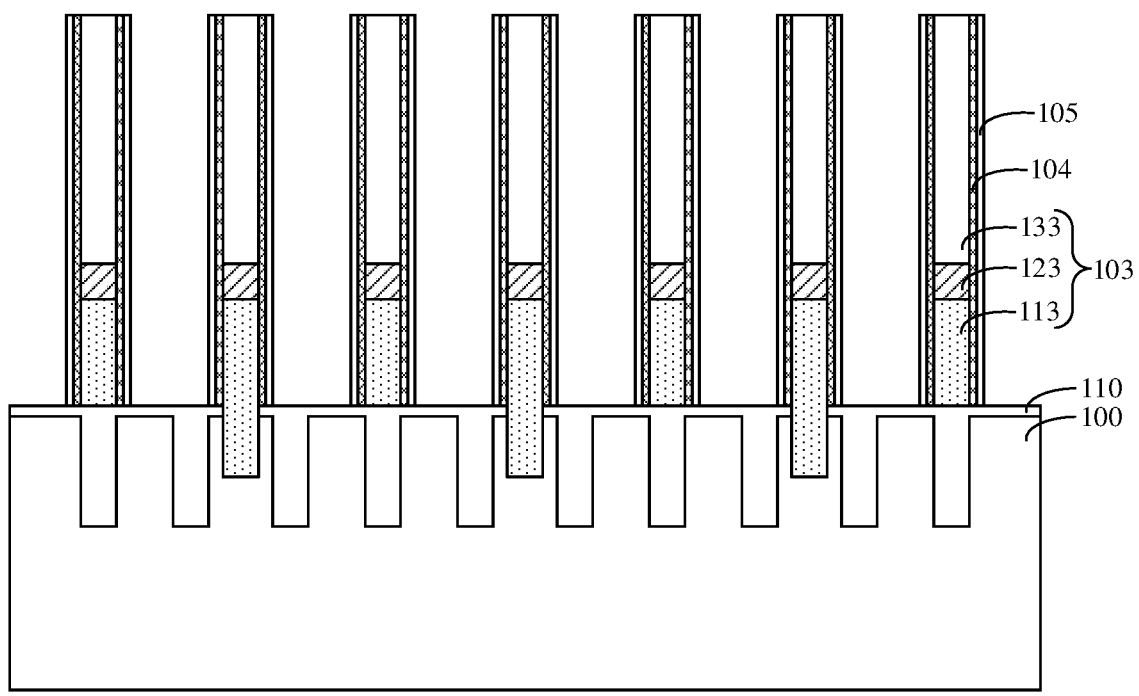

Referring to FIG. 5 and FIG. 6, isolation layer 105 is formed on a sidewall of the first sacrificial layers 104.

The isolation layer 105 is configured to separate the formed first sacrificial layer 104 and the subsequently formed second sacrificial layer, so that the subsequently formed first air gap and second air gap are separated.

In some embodiments, the material of the isolation layer 105 is an insulating material, such as silicon nitride, silicon oxynitride or silicon oxide. In this embodiment, the material of the isolation layer 105 is the same as the material of the top dielectric layer 133, that is, the material of the isolation layer 105 is silicon nitride. In other embodiments, the material of the isolation layer may be different from the material of the top dielectric layer.

In some embodiments, the forming method of the first sacrificial layer 104 and the isolation layer 105 is as follows.

A first sacrificial film is formed on sidewalls of the bit line structure103 and a surface of the substrate 100.

In some embodiments, the first sacrificial film is formed by an Atomic Layer Deposition (ALD) process or a Chemical Vapor Deposition (CVD) process. In this embodiment, the first sacrificial film is formed by an ALD process, and the first sacrificial film formed by the ALD process has good coverage. In other embodiments, for example, the first sacrificial film may be formed by the CVD process at 500° C. or 600° C. It should be noted that the above examples of specific temperature parameters using CVD are only for the understanding of those skilled in the art, and do not constitute a limitation on this solution. In practical applications, the parameters in the above range shall fall within the protection scope of the present disclosure.

A part of the first sacrificial film on the surface of the substrate 100 is removed to form first sacrificial layer 104. At this time, the formed first sacrificial layer 104 is only located on the sidewalls of the bit line structure 103.

An isolation film is formed on the sidewalls of the first sacrificial layer 104, the surface of the substrate 100 and the top surface of the bit line structure 103. In this embodiment, the forming method of the isolation film is the same as the above forming method of the first sacrificial film, which will not be repeated here. The isolation film on the top surface of the bit line structure 103 and the surface of the substrate 100 are removed to form isolation layer 105. At this time, the formed isolation layer 105 is only located on the sidewall of the first sacrificial layers 104.

It should be noted that in other embodiments, the steps of forming the isolation layer may be omitted, that is, the isolation layer is not formed on the sidewall of the first sacrificial layer. In the process of not forming the isolation layer, the formed first sacrificial layer is in contact with the subsequently formed second sacrificial layer, that is, the subsequently formed first air gap and second air gap are communicated.

First dielectric layer 106 filling gaps between adjacent bit line structures 103 are formed. A first dielectric layer 106 is patterned to form vias 107, the vias 107 expose active regions 101 of the substrate 100, and the vias 107 and the remaining parts of the first dielectric layer 106 are alternately arranged in an extension direction of the bit line structure 103. A second sacrificial layer 108 is formed on the sidewalls of a via 107, and the via 107 is filled to form a contact plug 109.

Figure 7:
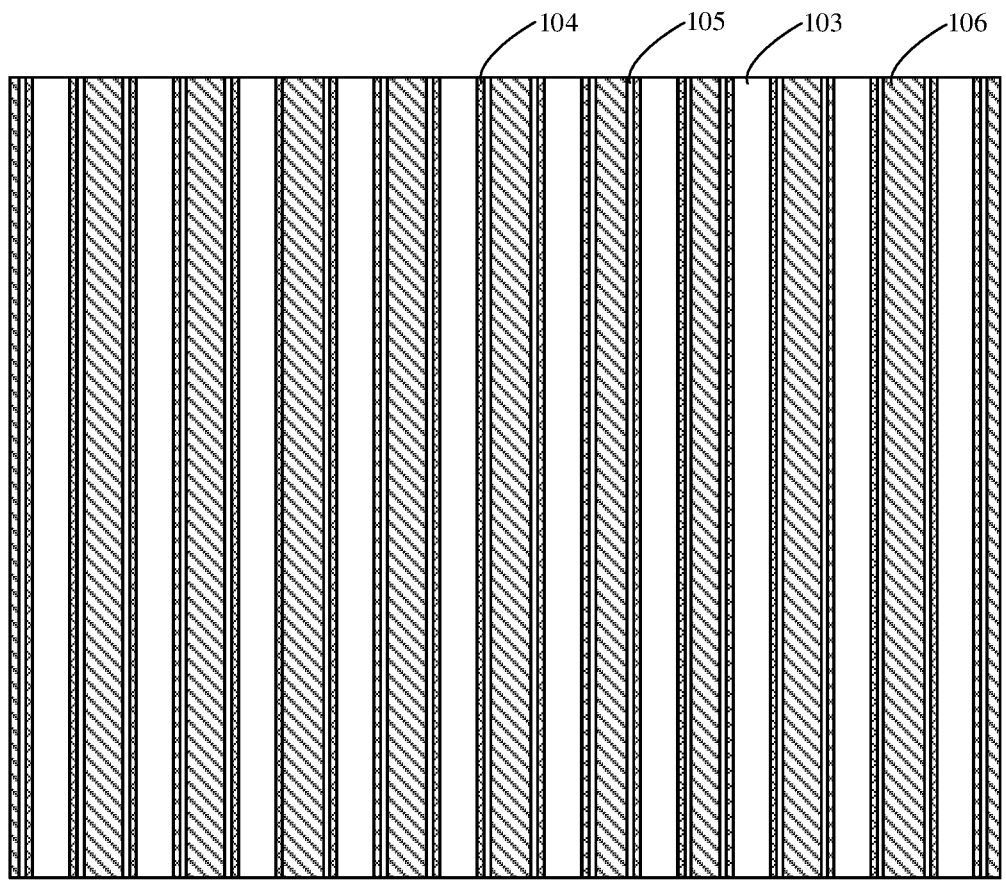
Figure 8:
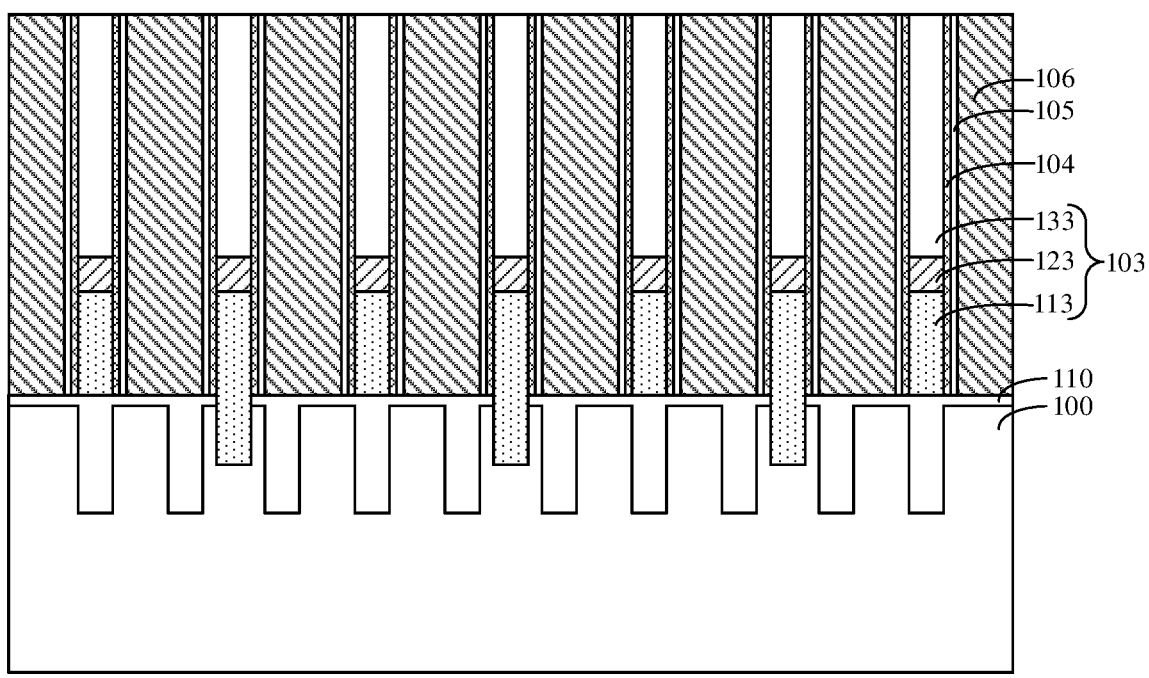

In some embodiments, referring to FIG. 7 and FIG. 8, first dielectric layer 106 filling gaps between adjacent bit line structures 103 is formed. The material of the first dielectric layer 106 may be different from the material of the top dielectric layer 133.

Figure 9:
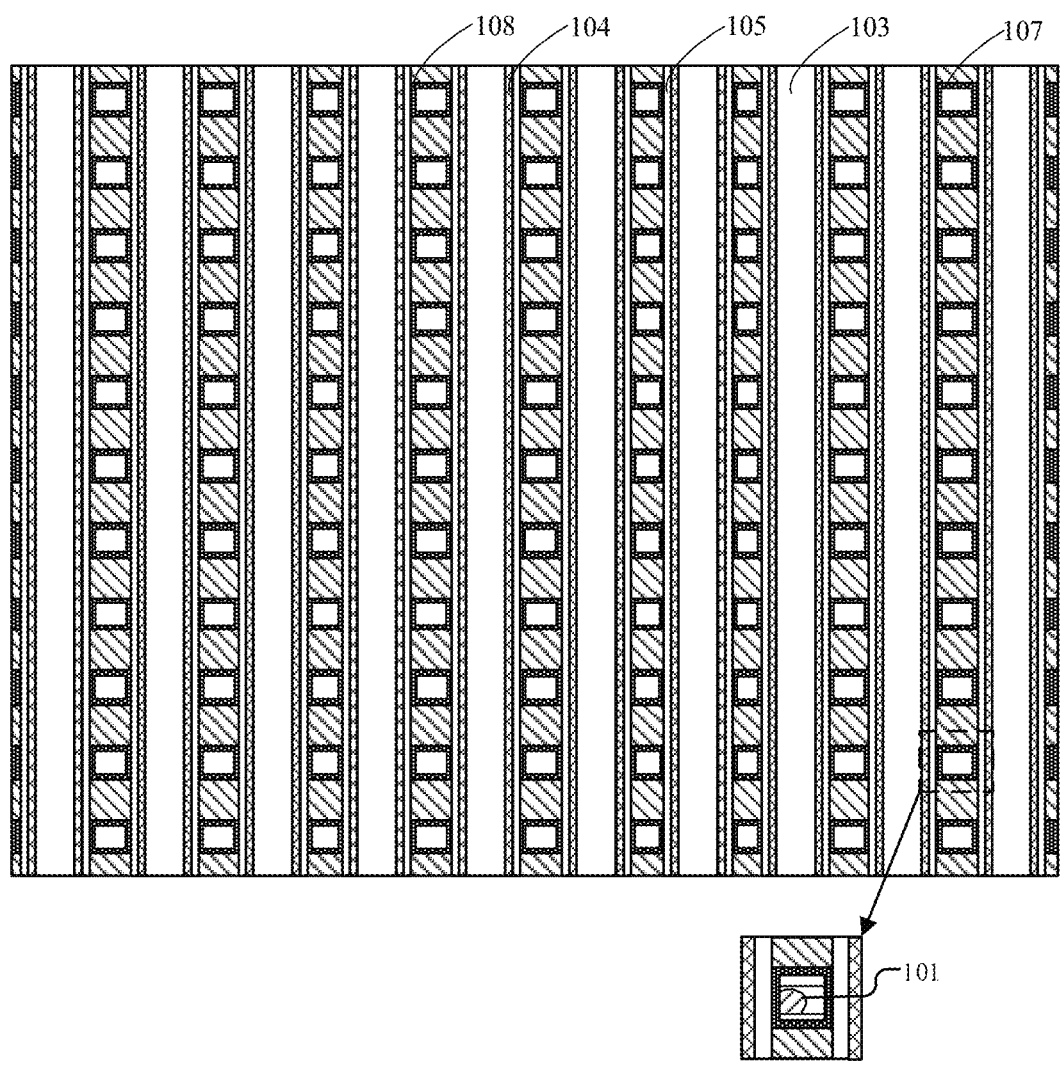
Figure 10:
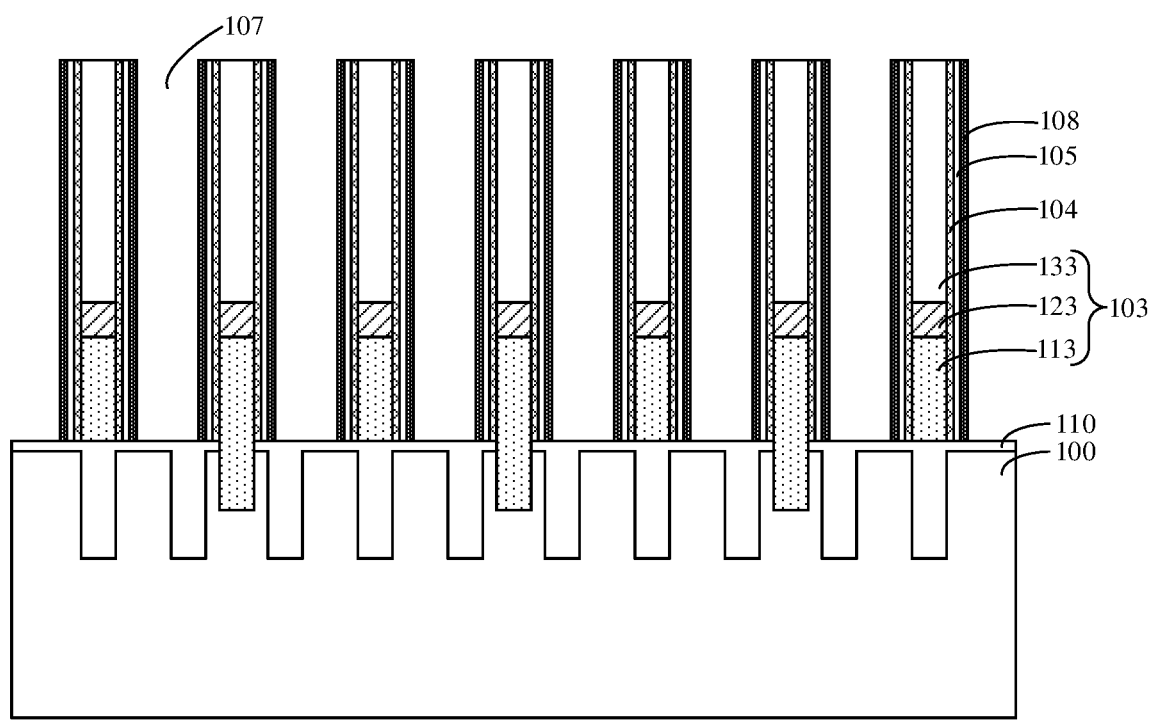

Referring to FIG. 9 and FIG. 10, the first dielectric layer 106 is patterned to form vias 107, the vias 107 expose active regions 101 of the substrate 100, and, the vias 107 and the remaining parts of the first dielectric layer 106 are alternately arranged in the extension direction of the bit line structure 103.

Since the material of the formed first dielectric layer 106 is different from the material of the top dielectric layer 133, the forming method of vias 107 at etching parts of the first dielectric layer 106 is as follows: a first mask layer is formed on the bit line structure 103 and the first dielectric layer 106. A part of the first mask layer on the first dielectric layer 106 is patterned to form first etching openings, and the remaining parts of the first mask layer and the first etching openings are alternately arranged in the extension direction of the bit line structure 103. The first dielectric layer 106 exposed by the first etching openings is etched by taking the remaining parts of the first mask layer as a mask to form the vias 107. In some embodiments, the first etching openings are linear patterns intersected with the extension direction of the bit line structure 103, and self-aligned etching is performed by means of the linear patterns and the etching selectivity of the first dielectric layer106 and the top dielectric layer 133 to form the vias107. In other embodiments, a part of the substrate at the bottom of the first dielectric layer needs to be etched so as to expose the active regions in the substrate.

A second sacrificial layer 108 is formed on the sidewalls of a via 107. The second sacrificial layer 108 is located on the sidewalls of a via 107 for subsequent etching to form second air gap surrounding the sidewalls of the a via 107, that is, the second sacrificial layer 108 is made of a material which is easily etched.

In some embodiments, the material of the second sacrificial layer 108 is a carbon-containing material. In the subsequent process of removing the second sacrificial layer 108 to form air gap, the sacrificial layer may be removed by means of incineration. The incineration gas reacts with the carbon-containing material to generate carbon dioxide gas, and then, the solid second sacrificial layer 108 is converted into carbon dioxide gas, thereby removing the sacrificial layer. Furthermore, the collapse phenomenon caused by a larger impact on the sidewalls of air isolation structures in the process of forming the air gap is avoided. In this embodiment, the forming method of the second sacrificial layer 108 is the same as the above forming method of the first sacrificial layer 104, which will not be repeated here. In other embodiments, the second sacrificial layer may be made of a material having a high etching selectivity for the surrounding materials, such as silicon oxide. The second sacrificial layer is removed by a wet etch process, thereby forming the first air gap.

In this embodiment, in the direction parallel to the surface of the substrate 100, the thickness of the second sacrificial layer 108 is greater than the thickness of the first sacrificial layer 104. Since the formed second sacrificial layer108 has corners, the second sacrificial layer 108 is more difficult to remove than the first sacrificial layer 104 under the same width. The thickness of the second sacrificial layer 108 is greater than the thickness of the first sacrificial layer 104 so as to ensure that the second sacrificial layer 108 may be completely removed. In this embodiment, the thickness of the second sacrificial layer 108 is 1 nm to 6 nm, such as 1 nm, 2 nm, 3 nm, 4 nm or 5 nm.

It should be noted that in other embodiments, the thickness of the second sacrificial layer may also be set to be the same as the thickness of the first sacrificial layer, or the thickness of the second sacrificial layer may be less than the thickness of the first sacrificial layer.

Figure 11:
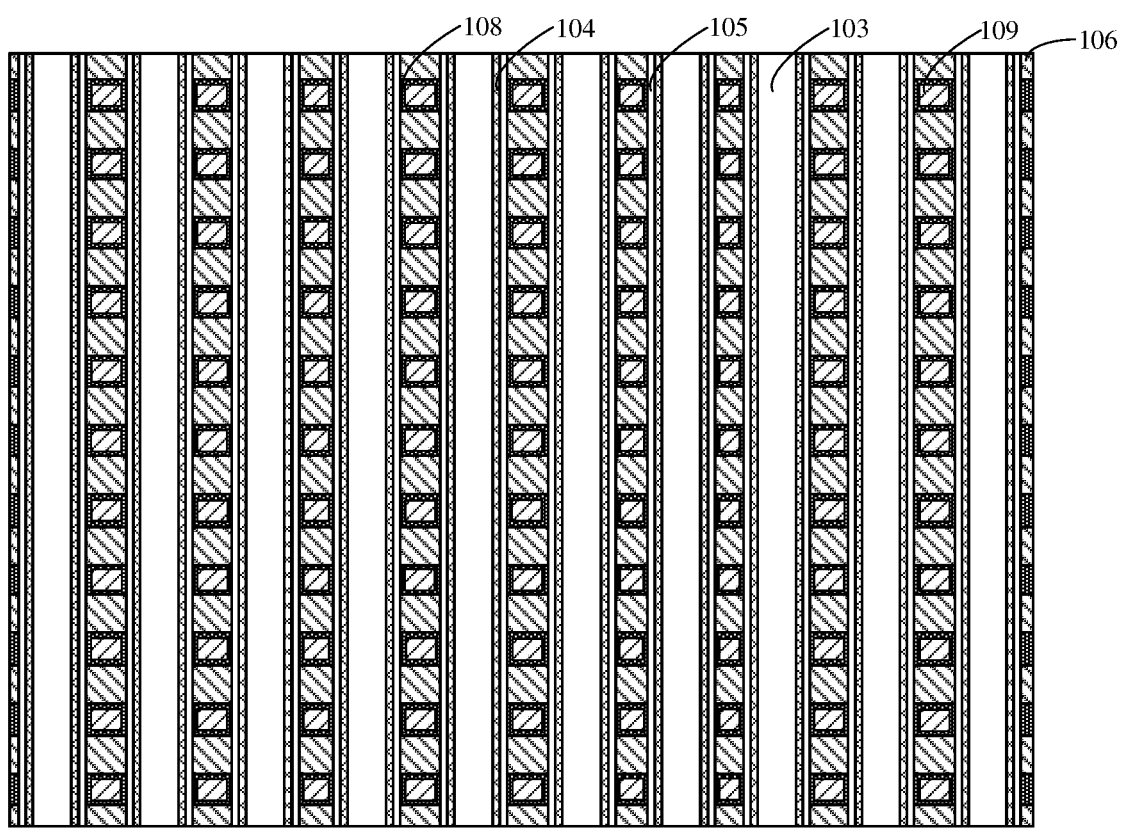
Figure 13:
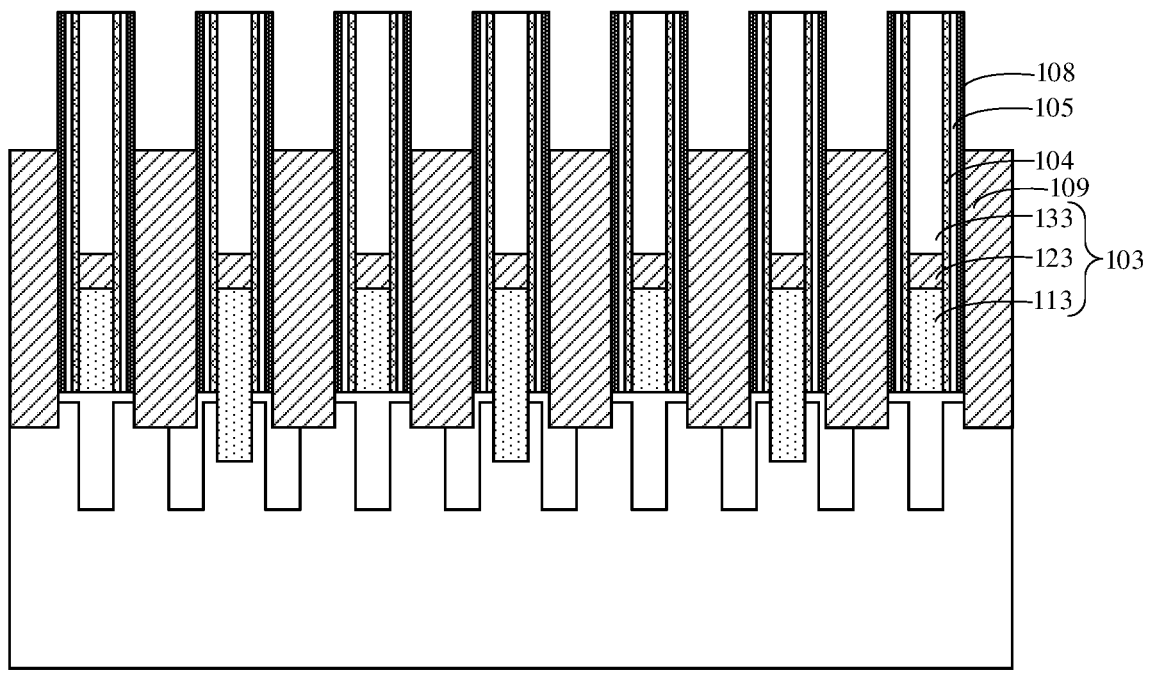

Referring to FIG. 11 and FIG. 13, the via 107 is filled to form contact plug 109.

Figure 12:
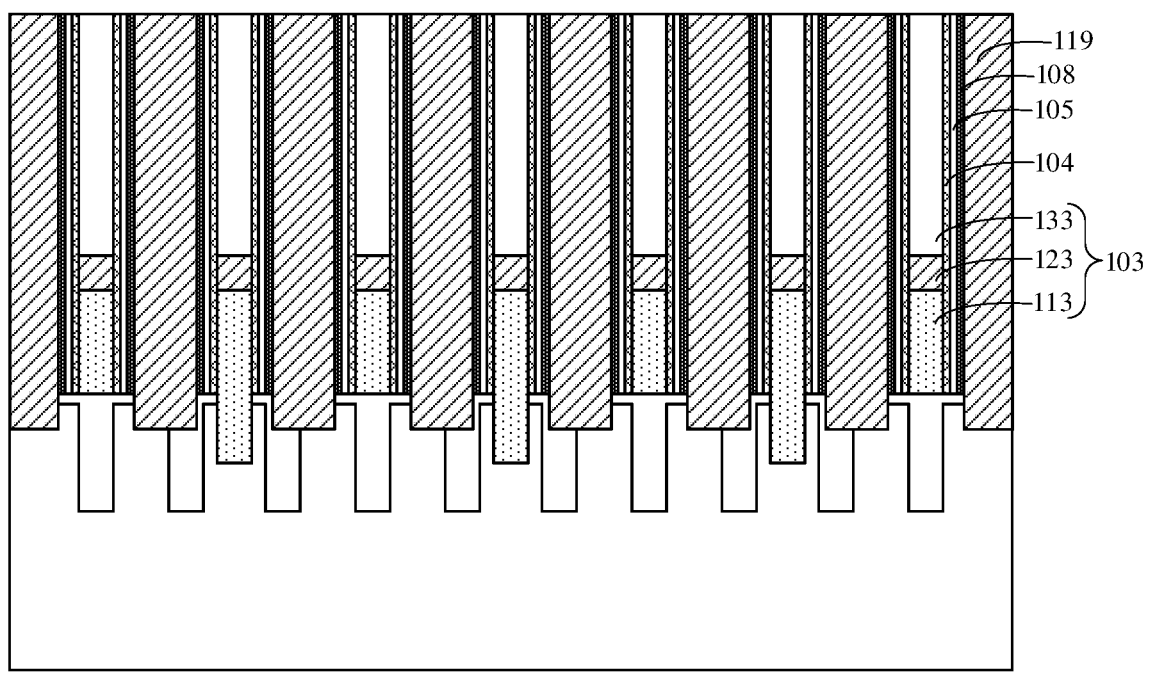

In some embodiments, referring to FIG. 12, the via 107 is filled to form bottom conductive layer 119, the height of the bottom conductive layer 119 is the same as the height of the bit line structure 103, and the material of the bottom conductive layer is polysilicon or silicon germanide, and bottom conductive layer 119 is used for forming an electrical connection with the active regions 101 of the substrate 100.

Referring to FIG. 13, a part of the bottom conductive layer 119 is etched to form contact plug 109, and the height of contact plug 109 is lower than the height of top surface of the bit line structure 103.

Figure 14:
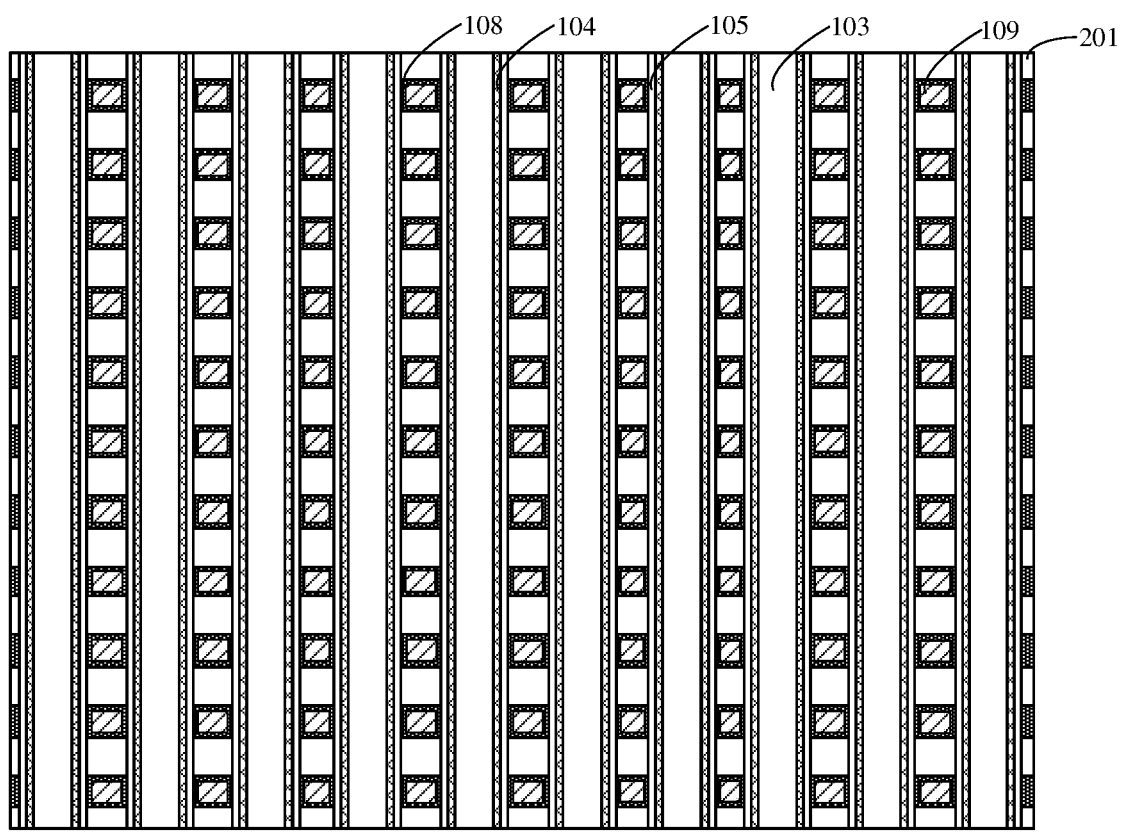

In this embodiment, the method further includes the following operations. Referring to FIG. 14, the first dielectric layer 106 is removed to form dielectric openings. Second dielectric layers 201 filling the dielectric openings are formed, and the material of the second dielectric layers 201 may be the same as the material of the top dielectric layer 133. In some embodiments, by means of using different materials for the first dielectric layer 106 and the surrounding top dielectric layer 133 and the contact plug 109, the first dielectric layer 106 may be etched in a self-aligned manner to form the dielectric openings, so that the process cost is saved. Furthermore, the vias 107 are formed by etching on the first dielectric layer 106, and the second dielectric layers 201 replace the first dielectric layer 106 as isolation dielectrics, so that the adjustment redundancy of the process is larger. For example, the silicon oxide which is easy to etch is used as the first dielectric layer 106 to reduce the etching difficulty of the vias 107, and the silicon nitride is used as the second dielectric layers 201 to achieve a better isolation effect.

Before contact structure is formed, the method further includes the following operation. Electrical connection layer (not shown), such as titanium nitride layer and tungsten silicide layer, is formed on the surface of the contact plug 109. By forming the electrical connection layer (not shown) between the contact plug 109 and the contact structure, the transmission loss of the current between the contact plug 109 and the contact structure is reduced.

Figure 15:
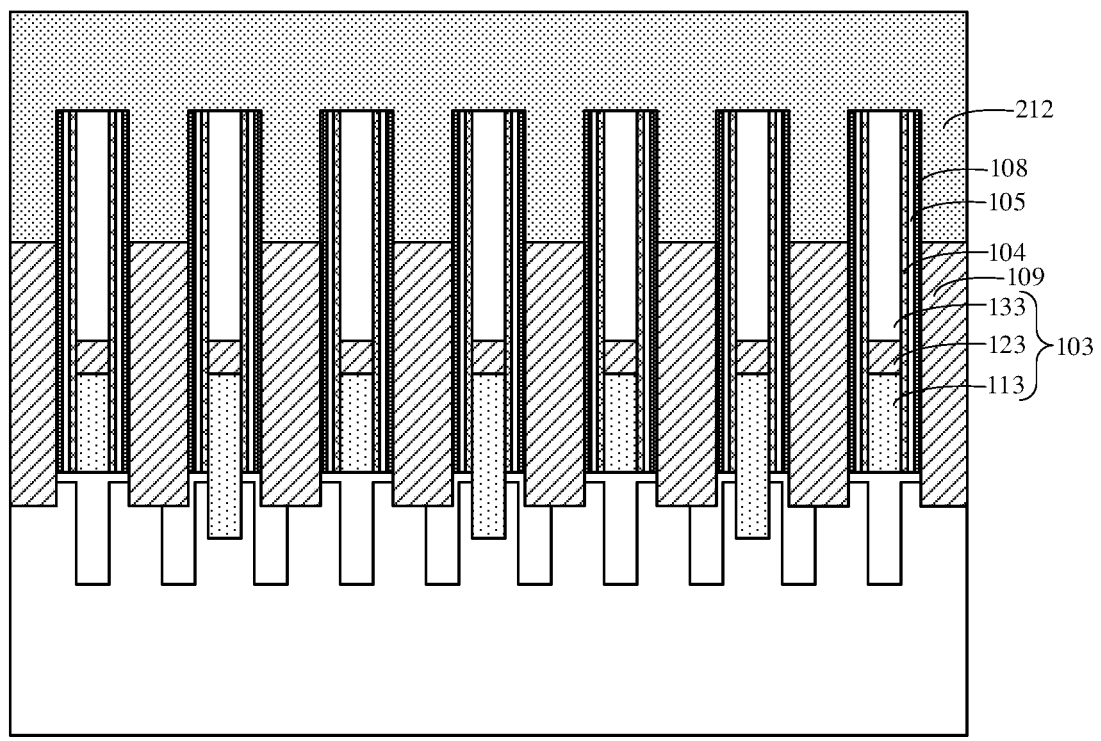
Figure 16:
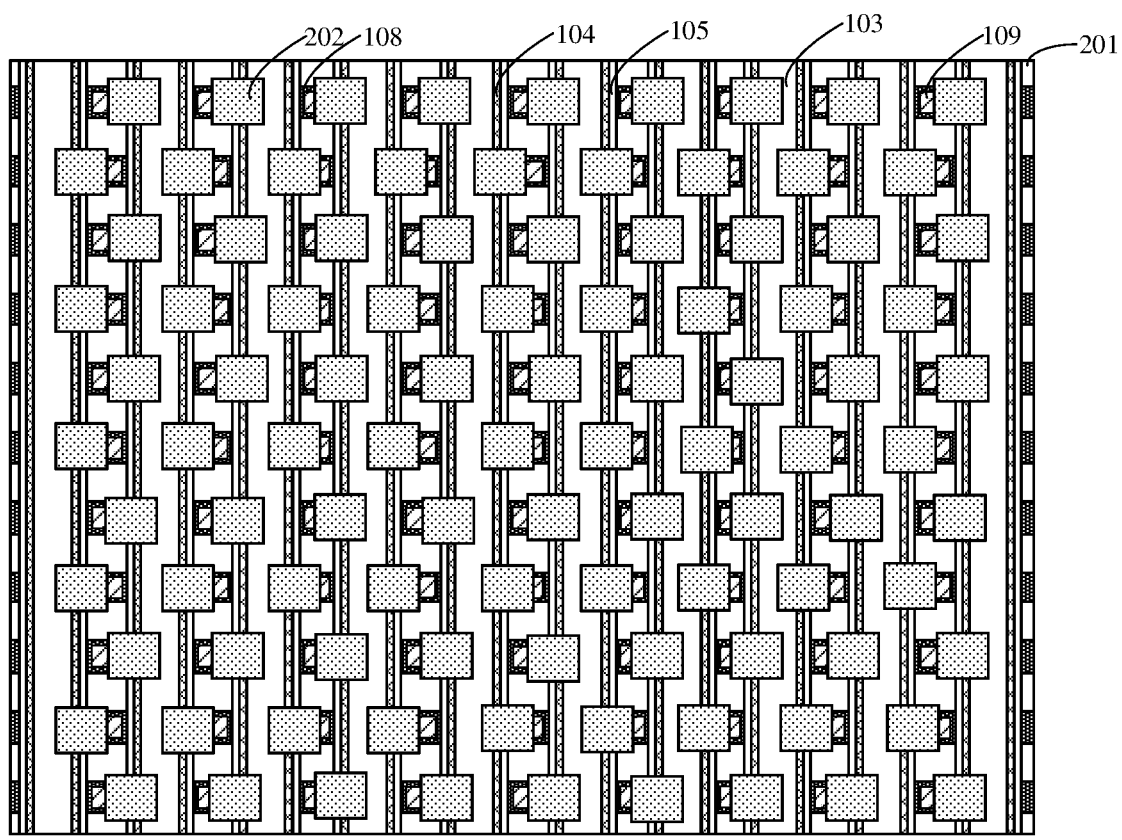
Figure 17:
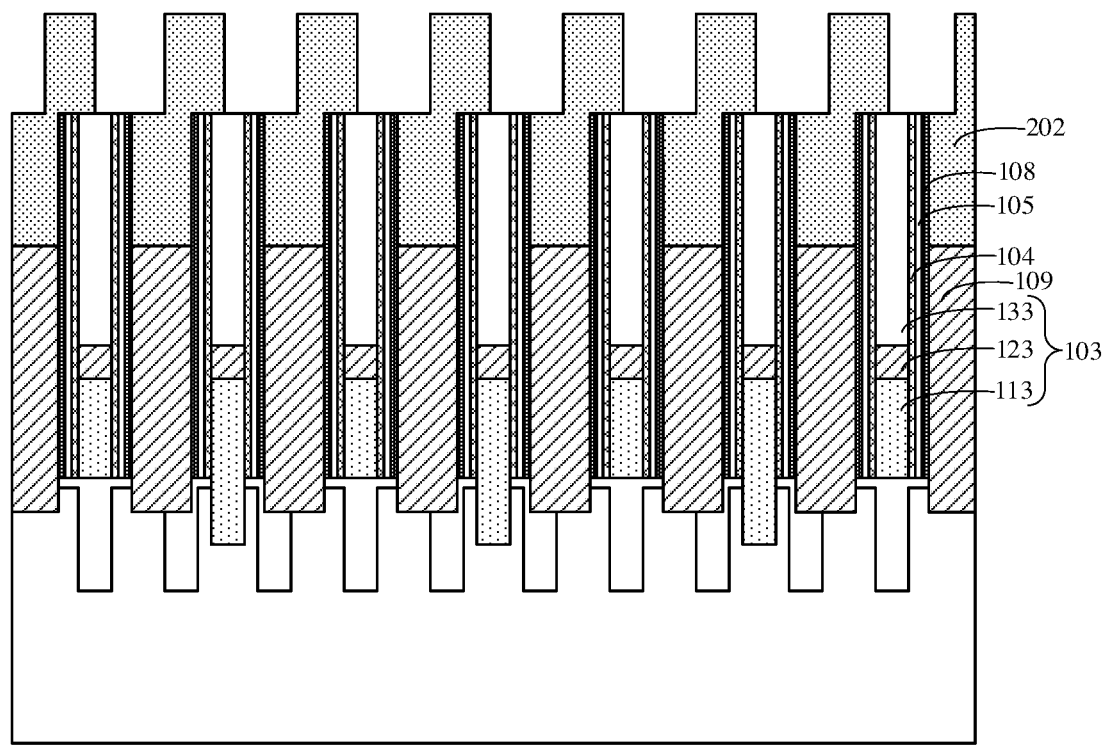

Referring to FIG. 15 to FIG. 17, a contact structure 202 is formed on the contact plug 109.

In some embodiments, referring to FIG. 15, a top conductive layer 212 is formed on the contact plugs 109 and on the bit line structures 103.

The top conductive layer 212 may be made of a conductive material or may be made of multiple conductive materials, such as doped polysilicon, titanium, titanium nitride, tungsten and tungsten composites. In this embodiment, the top conductive layer 212 is made of tungsten which has low resistance, so that the transmission loss of the current may be further reduced.

Referring to FIG. 16 and FIG. 17, the top conductive layer 212 is patterned to form contact structures 202. The contact structure 202 include part higher than the top surface of the bit line structure 103 and part located on the contact plug 109 in the gaps between the bit line structures 103. The part higher than the top surface of the bit line structure 103 is used as landing pad to form an electrical connection with the subsequently formed storage unit structure. In some embodiments, the contact plugs 109 are distributed in an aligned array, and the contact structures 202 are distributed in a staggered array. The projections of the contact structures 202 and the contact plugs 109 on the substrate are partially intersected, so that the first sacrificial layers 104 and the second sacrificial layers 108 are at least partially exposed to facilitate the subsequent etching to form air gaps.

Figure 18:
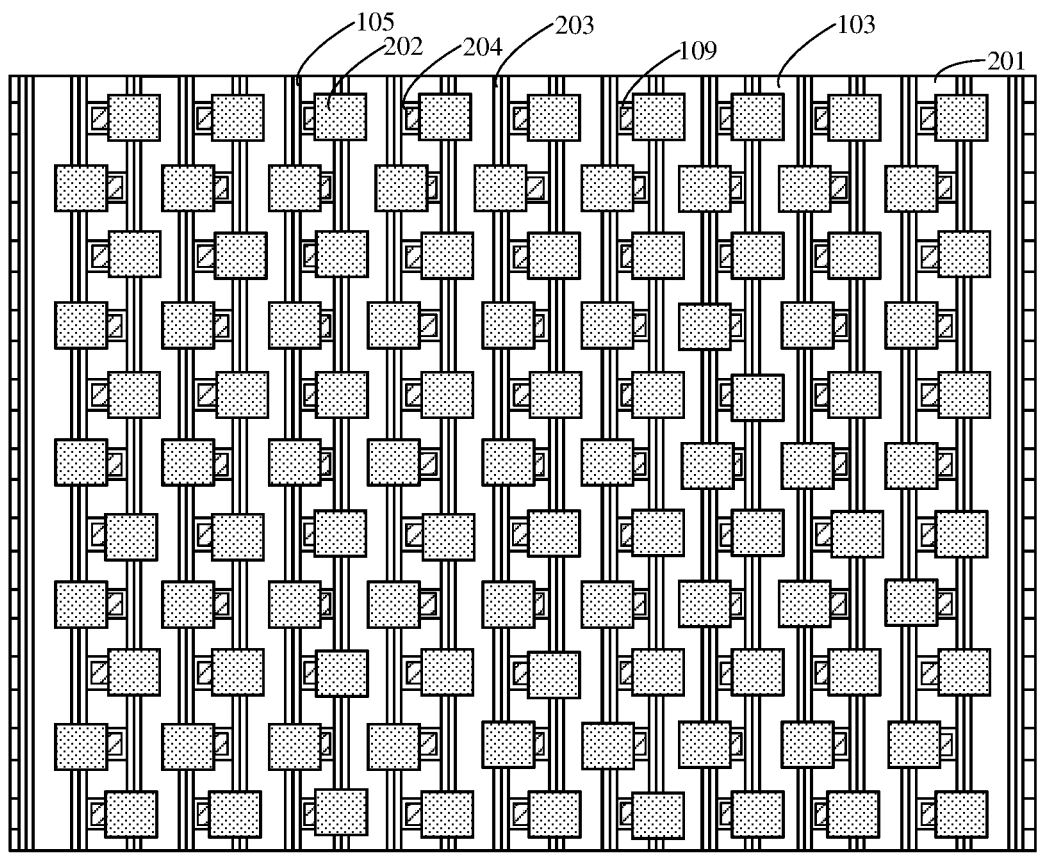
Figure 19:
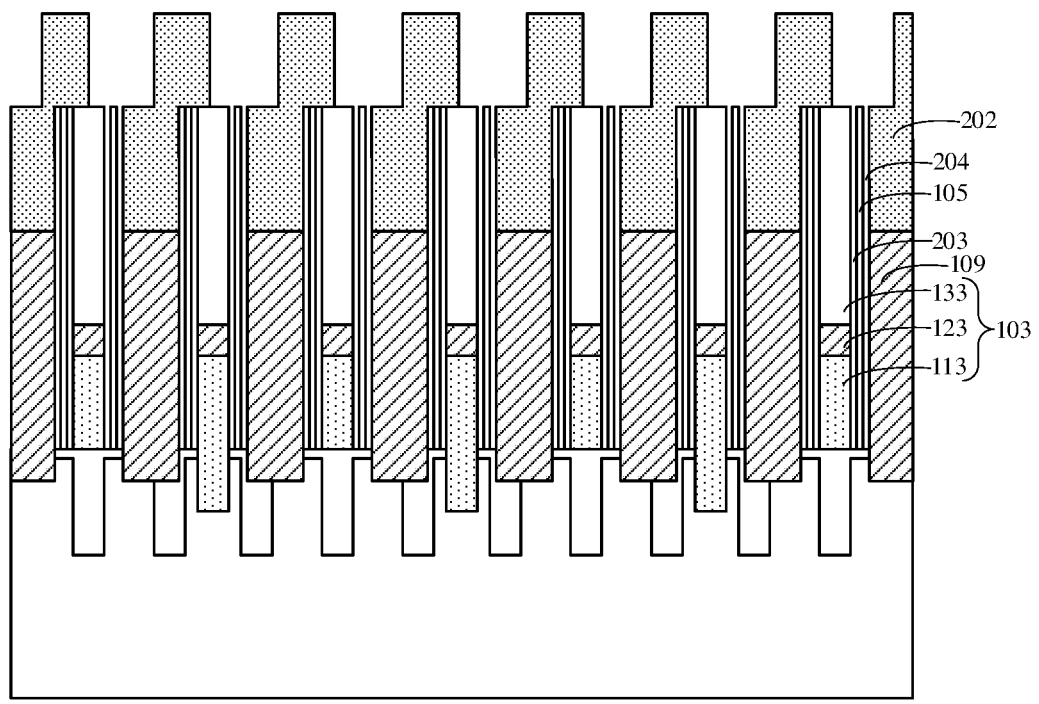
Figure 23:
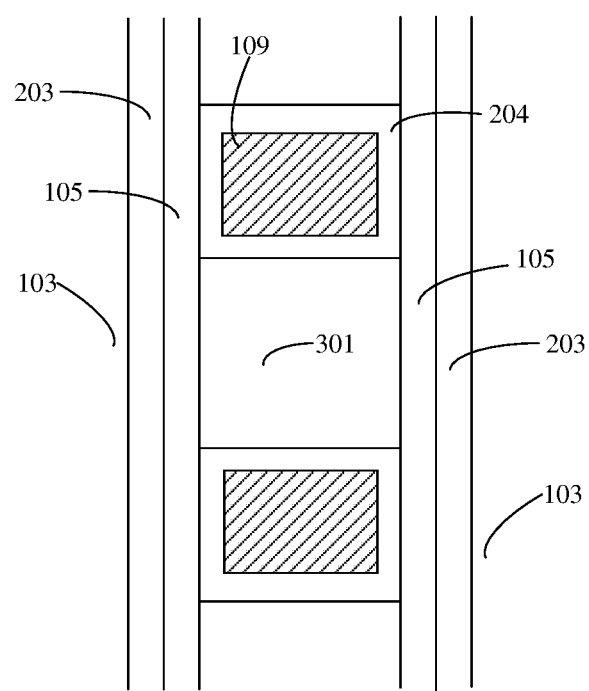
FIG. 23 and FIG. 24 are enlarged partial views of forming air gaps in a forming method of a semiconductor structure provided by an embodiment of the present disclosure.
Figure 24:
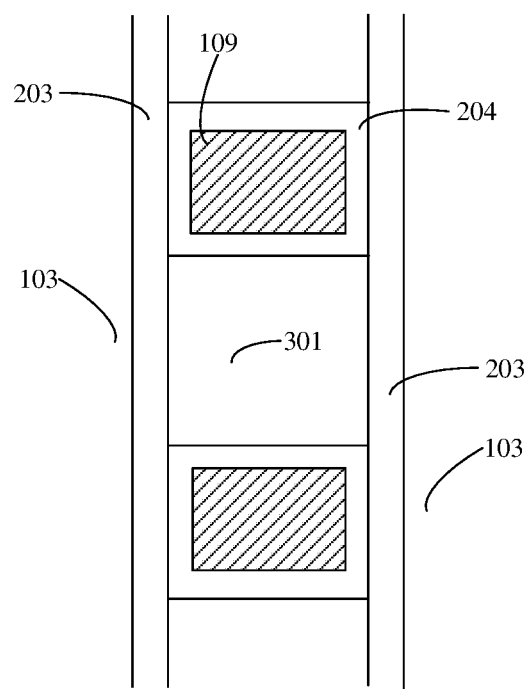

Referring to FIG. 18 and FIG. 19, the first sacrificial layer 104 is removed to form first air gap 203, and the second sacrificial layer 108 is removed to form second air gap. FIG. 23 and FIG. 24 are partial method schematic views.

In some embodiments, the first sacrificial layer 104 and the second sacrificial layer 108 are removed by means of incineration.

The sacrificial layers are removed by an incineration process to form air gaps, and the width of the formed air gaps is approximately equal to the thickness of the sacrificial layers. The process parameters of the incineration process include the following parameters. The flow rate of the incineration gas is 10000 sccm to 15000 sccm. The temperature is 150° C. to 350° C. The pressure is 500 mT to 800 mT. In some embodiments, the gas flow rate may be 11000 sccm, 12000 sccm, 13000 sccm or 14000 sccm, the temperature may be 200° C., 250° C. or 300° C., and the pressure may be 600 mT or 700 mT. It should be noted that the above examples of gas flow rate parameters, temperature parameters and pressure parameters are only for the understanding of those skilled in the art, and do not constitute a limitation on this solution. In practical applications, the parameters in the above range shall fall within the protection scope of the present disclosure.

The incineration gas used in the incineration process includes one or a combination of nitrogen, hydrogen or oxygen. The incineration gas generates a chemical reaction with the sacrificial layers made of a carbon-containing material or an oxygen-containing material, the solid sacrificial layers react to generate gaseous carbon dioxide or liquid water, a solid state is converted into a gas state or a liquid state, and thus, air gaps are formed. During formation of the air gaps by the incineration process, no larger impact force is caused to the sidewalls of the air gaps, so that the collapse phenomenon of the sidewalls of outer layers is avoided.

In other embodiments, the first sacrificial layer 104 and the second sacrificial layer 108 may be removed by a wet etch process.

At this time, the formed first air gap 203 and second air gap 204 are respectively located on two opposite sides of the isolation layer 105.

In an example, referring to FIG. 23, the space between adjacent bit line structures 103 includes first air gap 203, second air gap 204, isolation layer 105, contact plugs 109 and dielectric layers 301. The dielectric layers 301 may be the first dielectric layers formed by the above method, or may be the second dielectric layers formed by the above method. The first air gap 203 is located on the sidewalls of the bit line structures 103. The isolation layer 105 is arranged in parallel with the bit line structure 103 and configured to separate the first air gap 203 and the second air gap 204. In the extension direction of the bit line structure 103, the dielectric layers 301 and the contact plugs 109 are alternately arranged. The second air gap 204 surrounds the sidewalls of the contact plug 109.

In another example, in other embodiments where the isolation layers are not formed, referring to FIG. 24, the space between adjacent bit line structures 103 includes first air gap 203, second air gap 204, dielectric layers 301 and contact plugs 109. The first air gap 203 is located on the sidewalls of the bit line structures 103. In the extension direction of the bit line structure 103, the dielectric layers 301 and the contact plugs 109 are alternately arranged. The second air gap 204 surrounds the sidewalls of the contact plug 109, and the first air gap 203 between the contact plugs 109 and the bit line structures 103 communicates with the second air gap 204.

Figure 20:
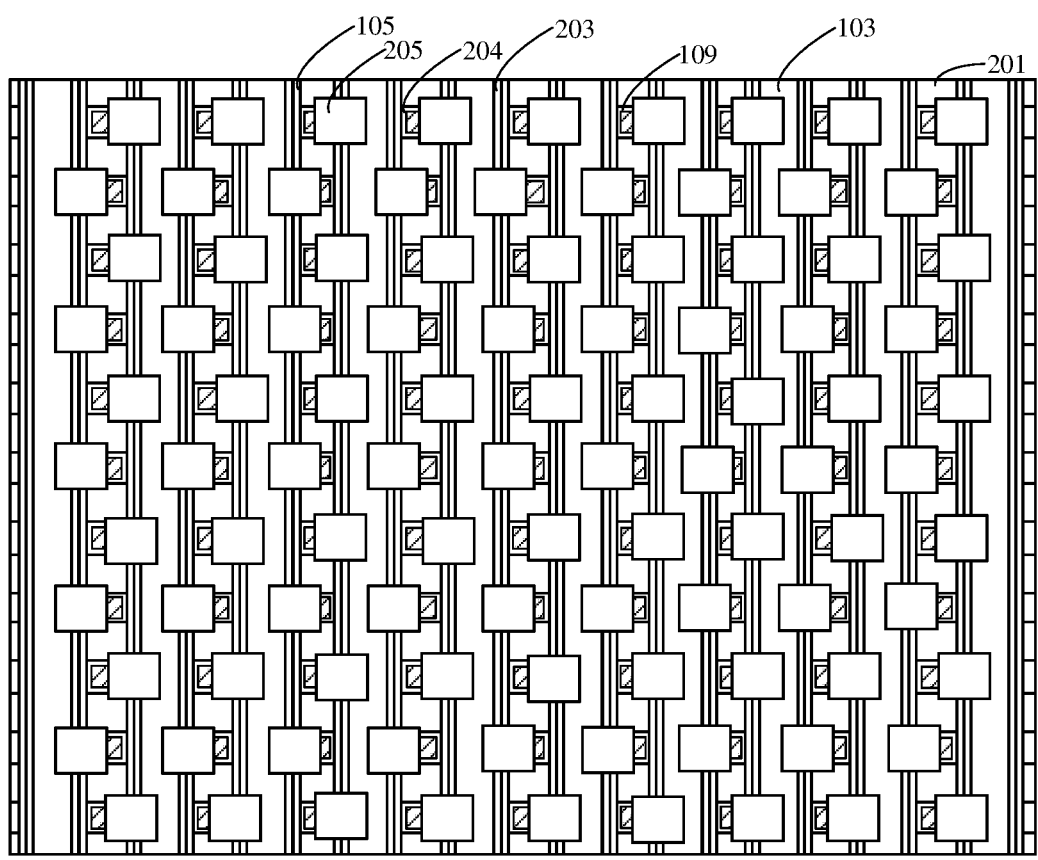
Figure 21:
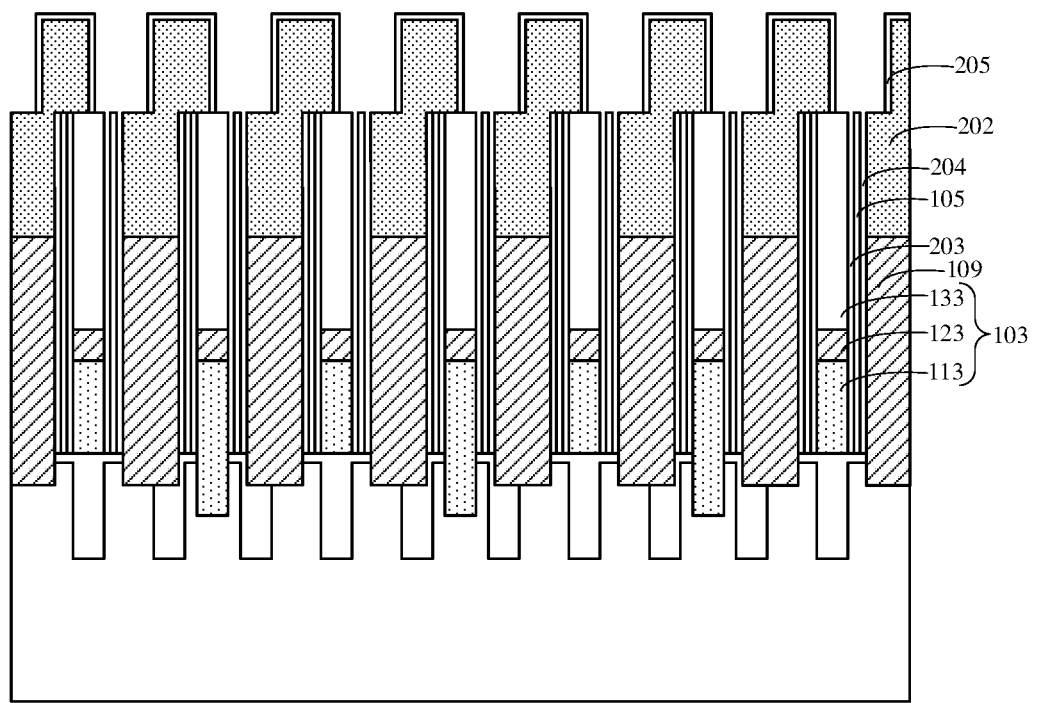

Referring to FIG. 20 and FIG. 21, barrier layer 205 is formed on the upper surface and sidewalls of the contact structure. By forming the barrier layer between the contact structure 202 and the subsequently formed sealing layer, conductive particles in the contact structure 202 are prevented from diffusing into the sealing layer, thereby forming an electrical connection between the separate contact structures 202.

Figure 22:
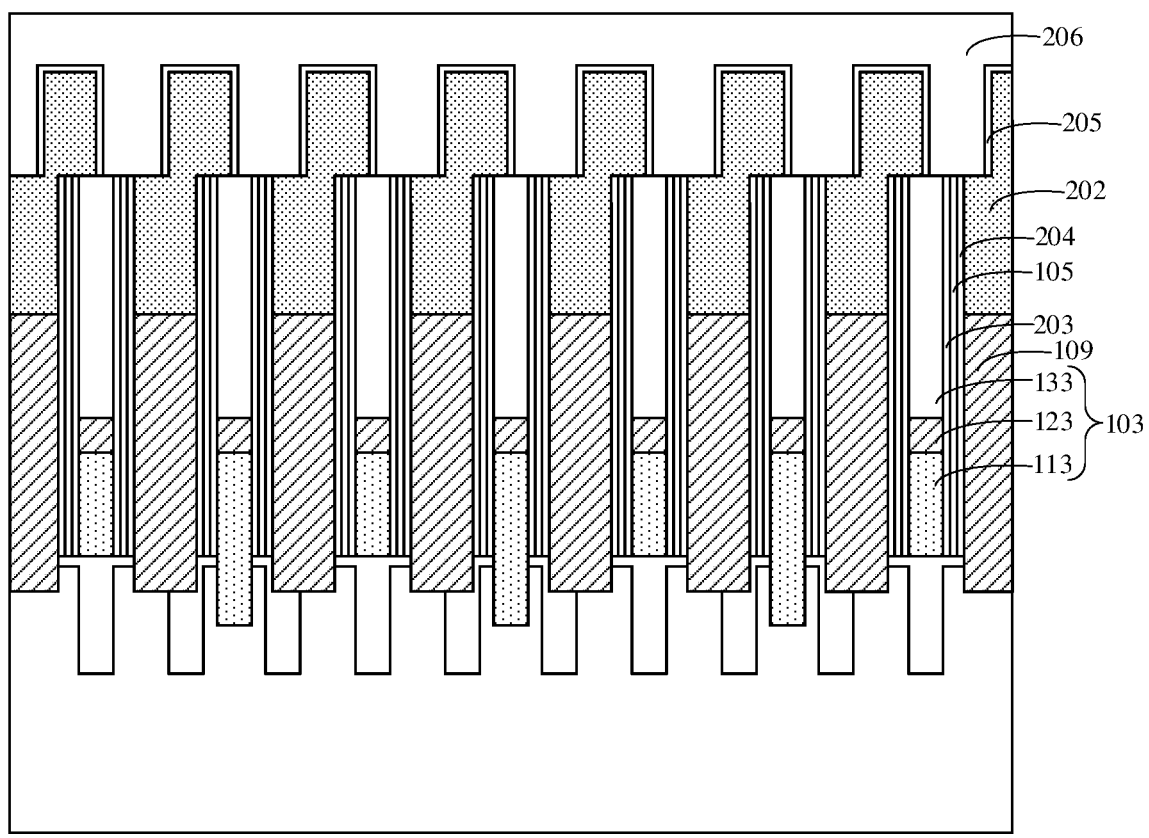

Referring to FIG. 22, the air gaps are sealed to form a sealing layer 206 located on the surfaces of the air gaps.

The first sacrificial layer is formed on the sidewalls of the bit line structure, and the second sacrificial layer is formed on the sidewalls of the contact plugs. In the subsequent manufacturing processes, by removing the first sacrificial layer and the second sacrificial layer, the first air gap on the sidewalls of the bit line structures and the second air gap on the sidewalls of the contact plugs are formed. Compared with the related technologies only forming a layer of air gap, by forming two layers of air gaps, the effect of reducing parasitic capacitance is better, and the formed air gaps are easy to seal.

The division of the above steps is only for clarity of description. When implemented, the steps may be combined into one step or some steps may be split into multiple steps, as long as they include the same logical relationship, they are all within the protection scope of this patent. Adding insignificant modifications or introducing insignificant designs to the process without changing the core design of the process are all within the protection scope of this patent.

Another embodiment of the present disclosure provides a forming method of a semiconductor structure, which is substantially the same as the previous embodiment. The main difference is that a part of first air gap formed in this embodiment is located at the bottom of the isolation layer, and the first air gap at the bottom of the isolation layer communicates with the second air gap.

FIG. 25 to FIG. 28 are schematic cross-sectional views corresponding to each of the steps in a forming method of first air gap and second air gap in a semiconductor structure provided by an embodiment of the present disclosure. The forming method of the semiconductor structure of this embodiment will be described below.

Referring to FIG. 1 and FIG. 2, a substrate 100 is provided, and separate bit line structures 103 are formed on the substrate 100.

Figure 25:
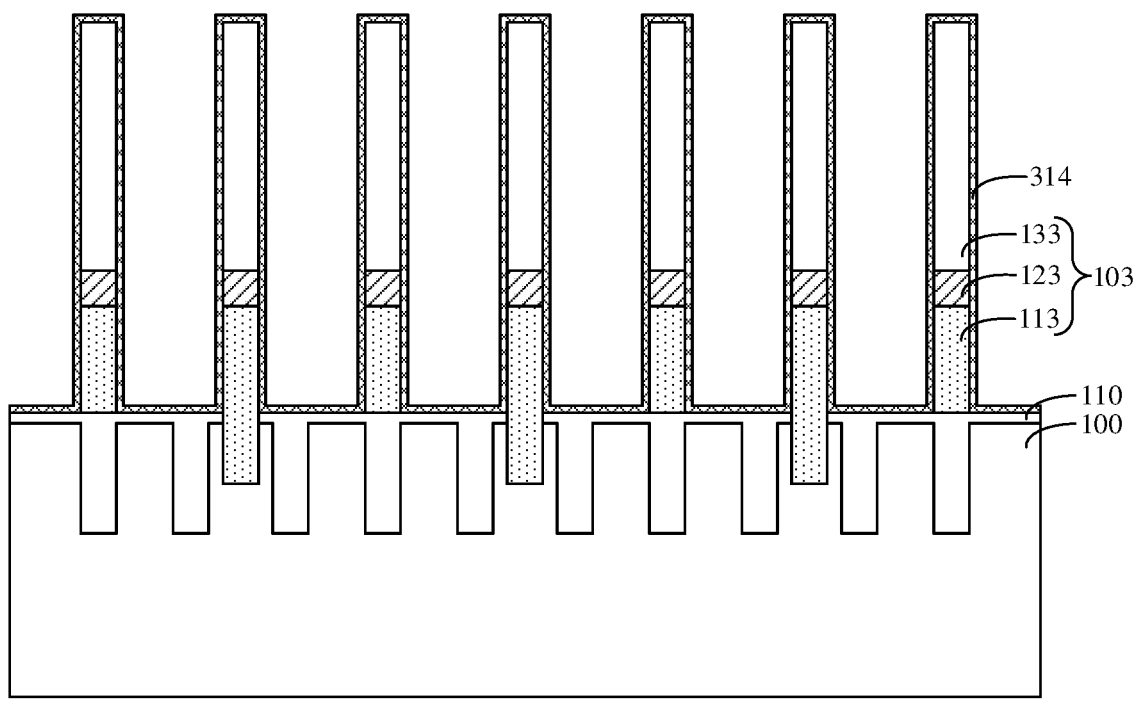
FIG. 25 to FIG. 28 are schematic cross-sectional views corresponding to each of the steps in the process of forming communicated first air gap and second air gap in a forming method of a semiconductor structure provided by another embodiment of the present disclosure.

Referring to FIG. 25, a first sacrificial film 314 is formed on sidewalls of the bit line structure 103 and the surface of the substrate 100.

Figure 26:
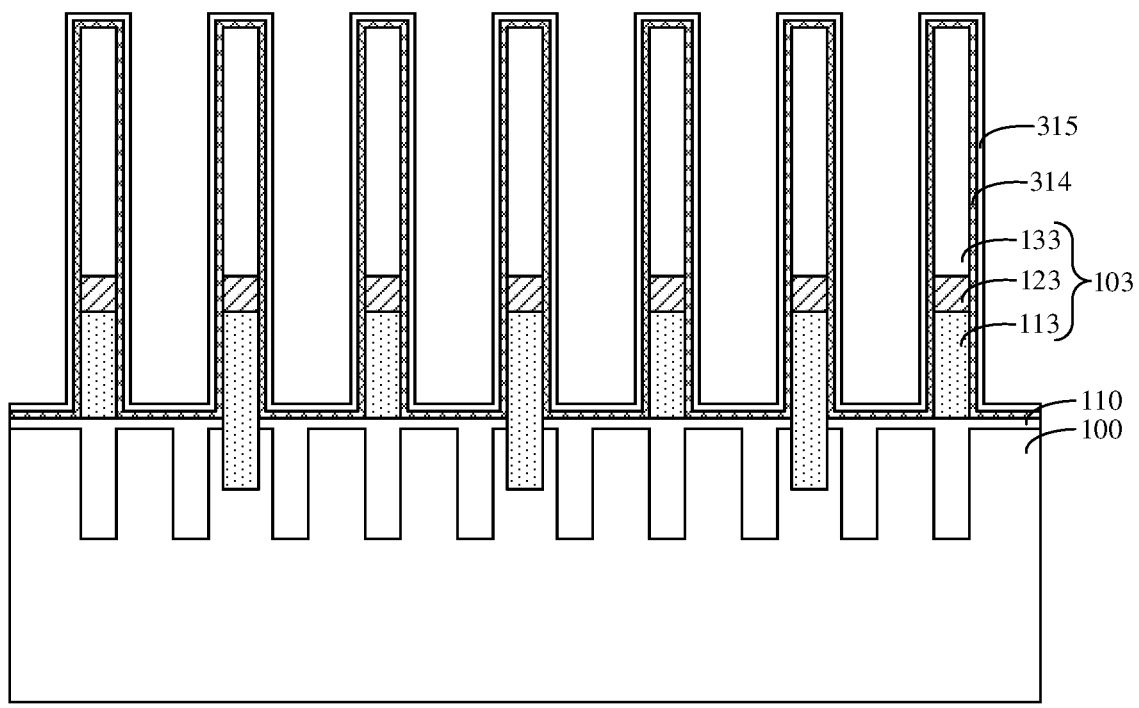

Referring to FIG. 26, isolation film 315 is formed on sidewalls of the first sacrificial film 314 and surface of the first sacrificial film 314 on the surface of the substrate 100.

Figure 27:
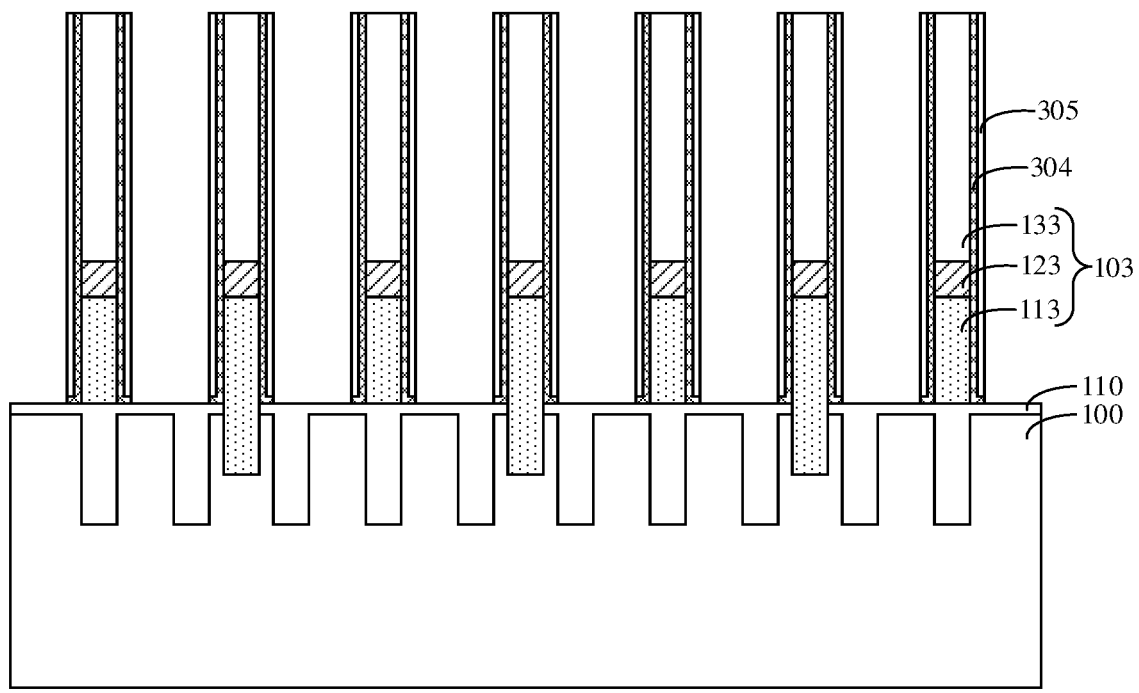

Referring to FIG. 27, the first sacrificial film 314 and the isolation film 315 on the substrate 100 are removed to form isolation layer 305 and first sacrificial layer 304. At this time, a part of first sacrificial layer 304 is located at the bottom of the isolation layer 305.

Referring to FIG. 7 to FIG. 13, dielectric layer filling gaps between adjacent bit line structures 103 is formed. The dielectric layer is patterned to form vias 107, the vias 107 expose active regions 101 of the substrate 100, and the vias 107 and the remaining parts of the dielectric layer are alternately arranged in an extension direction of the bit line structure 103. Second sacrificial layer 108 is formed on the sidewalls of a via 107, and the via 107 is filled to form contact plug 109.

Referring to FIG. 15 to FIG. 17, contact structure 202 is formed on the contact plug 109.

Referring to FIG. 18 and FIG. 19, the first sacrificial layer 104 is removed to form a first air gap 203, and the second sacrificial layer 108 is removed to form a second air gap.

Figure 28:
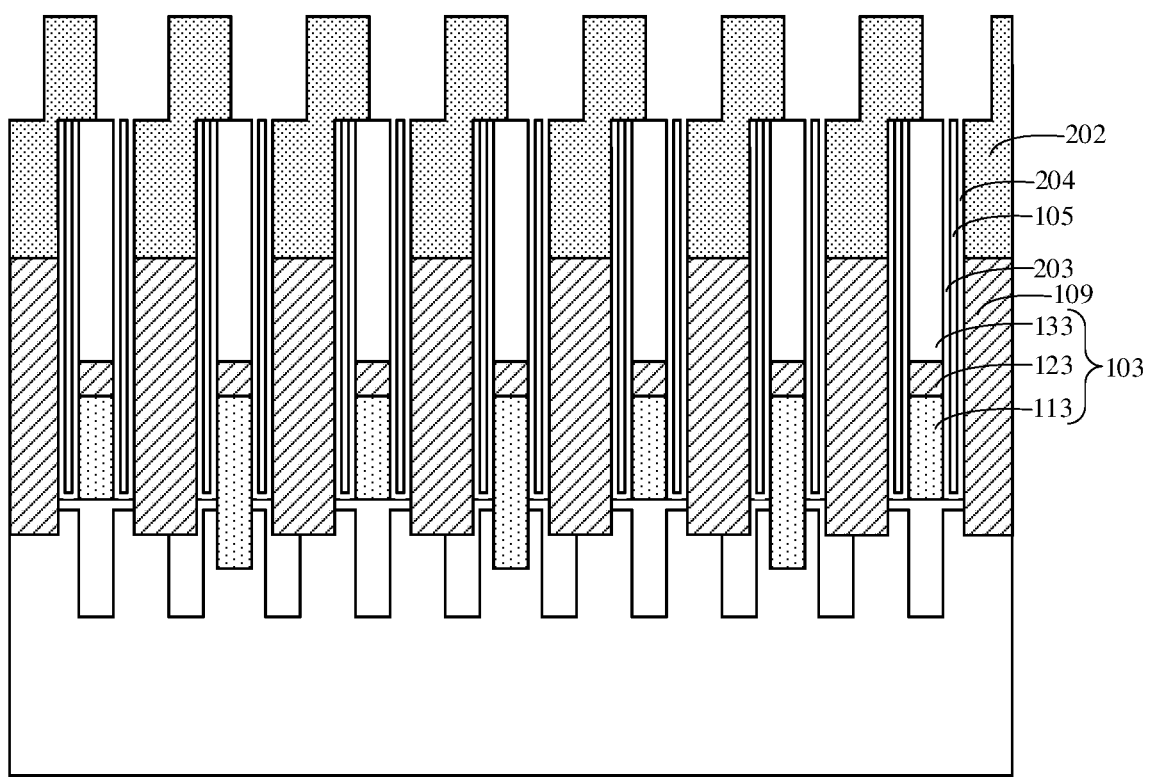

Referring to FIG. 28, the part of first air gap 203 formed based on the above method is located at the bottom of the isolation layer 305, and the first air gap 203 and the second air gap 204 communicate at the bottom of the isolation layer 305.

Referring to FIG. 20 and FIG. 21, barrier layer 205 is formed on the upper surface and sidewalls of the contact structure. By forming the barrier layer between the contact structure 202 and the subsequently formed sealing layer, conductive particles in the contact structure 202 are prevented from diffusing into the sealing layer, thereby forming an electrical connection between the separate contact structures 202.

Referring to FIG. 22, the air gaps are sealed to form a sealing layer 206 located on the surfaces of the air gaps.

The part of first sacrificial layer formed by the forming method of the first sacrificial layer and the isolation layer provided by this embodiment is located at the bottom of the isolation layer. In the subsequent process of removing the sacrificial layer to form air gaps, since the first sacrificial layer at the bottom of the isolation layer communicate with the second sacrificial layer, the removal effect is better.

The first sacrificial layer is formed on the sidewalls of the bit line structures, and the second sacrificial layer is formed on the sidewalls of the contact plugs. In the subsequent manufacturing processes, by removing the first sacrificial layer and the second sacrificial layer, the first air gap on the sidewalls of the bit line structure and the second air gap on the sidewalls of the contact plug are formed. Compared with the related technologies only forming a layer of air gap, by forming two layers of air gaps, the effect of reducing parasitic capacitance is better, and the formed air gaps are easy to seal.

The division of the above steps is only for clarity of description. When implemented, the steps may be combined into one step or some steps may be split into multiple steps, as long as they include the same logical relationship, they are all within the protection scope of this patent. Adding insignificant modifications or introducing insignificant designs to the process without changing the core design of the process are all within the protection scope of this patent.

Since the above embodiments and this embodiment correspond to each other, this embodiment may be implemented in cooperation with the above embodiments. The related technical details mentioned in the above embodiments are still valid in this embodiment, and the technical effects that can be achieved in the above embodiments can also be achieved in this embodiment. In order to reduce repetition, the details are not described here. Correspondingly, the related technical details mentioned in this embodiment can also be applied to the above embodiments.

Another embodiment of the present disclosure relates to a semiconductor structure.

Referring to FIG. 20 and FIG. 22, the semiconductor structure provided by this embodiment will be described in detail below with reference to the drawings, and the parts that are the same as or corresponding to the above embodiments will not be described in detail below.

The semiconductor structure includes: a substrate 100 and separate bit line structures 103 located on the substrate 100; dielectric layers 201 and contact plugs 109, where, the dielectric layers 201 and the contact plugs 109 are located in gaps between the separate bit line structures 103, and the contact plugs 109 and the dielectric layers 201 are alternately arranged in extension directions of the bit line structures; a contact structure 202 located on a contact plugs 109; a part of first air gap 203 located between a bit line structure 103 and the dielectric layer 201 and a part of the first air gap located between the bit line structure 103 and the contact plug 109; and a second air gap 204 surrounding the contact plug 109, where, a part of the second air gap 204 is located between the bit line structure 103 and the contact plug 109.

In some embodiments, the substrate 100 includes active regions 101 and word line structures 102.

In this embodiment, the substrate 100 is made of a silicon material. It should be clear to those skilled in the art that the use of the silicon material as the substrate 100 in this embodiment is to facilitate the understanding of the subsequent forming method by those skilled in the art, and does not constitute a limitation. In a practical application process, suitable substrate materials may be selected according to requirements.

A plurality of active regions 101 are arranged in parallel at intervals, the word line structure 102 and the bit line structure 103 are perpendicular to each other, and a single active region 101 is intersected with two word line structures 102. It should be noted that the substrate 100 further includes other semiconductor structures in addition to the word line structure 102 and the active region 101, such as shallow trench isolation structure 110 (referring to FIG. 2), etc. Since other semiconductor structures do not involve the core technology of the present disclosure, other semiconductor structures will not be described here. Those skilled in the art can understand that the substrate 100 further includes other semiconductor structures in addition to the word line structure 102 and the active region 101 for normal operation of the semiconductor structure.

The extension direction of the bit line structure 103 is perpendicular to the extension direction of the word line structure 102. The bit line structure 103 includes a bit line contact layer 113, a metal layer 123 and a top dielectric layer 133 which are stacked in sequence. On a cross section perpendicular to the extension direction of the bit line structure 103, only one of the two adjacent bit line structures 103 is connected to the active regions 101 of the substrate 100.

The material of the bit line contact layer 113 includes silicon germanium or polysilicon. The metal layer 123 may be made of a conductive material or the metal layer 123 may be made of multiple conductive materials, such as doped polysilicon, titanium, titanium nitride, tungsten and tungsten composites. The material of the top dielectric layers 133 includes silicon nitride, silicon dioxide or silicon oxynitride. In this embodiment, the material of the top dielectric layers 133 is silicon nitride.

In this embodiment, the semiconductor structure further includes isolation layers 105. The isolation layers 105 and the bit line structures 103 are arranged in parallel. The first air gap 203 is located between the bit line structure 103 and the isolation layer 105. A part of the second air gap 204 is located between the isolation layer 105 and the contact plug 109 and a part of the second air gap is located between the contact plugs 109 and the isolation layer 105, and the first air gap 203 and the second air gap 204 are respectively located on two opposite sides of the isolation layer 105. The material of the isolation layer 105 is an insulating material, such as silicon nitride, silicon oxynitride or silicon oxide. In this embodiment, the material of the isolation layer 105 is the same as the material of the top dielectric layer 133, that is, the material of the isolation layer 105 is silicon nitride.

The material of the dielectric layer 201 is the same as the material of the top dielectric layer 133. The material of the contact plug 109 is polysilicon or silicon germanide for forming an electrical connection with the active regions 101 of the substrate 100.

The contact structure 202 includes part higher than the top surface of the bit line structure 103 and part located on the contact plug 109 in the gaps between the bit line structures 103. The part higher than the top surface of the bit line structure 103 is used as landing pad to form an electrical connection with the subsequently formed storage units. In some embodiments, the contact plugs 109 are distributed in an aligned array, and the contact structures 202 are distributed in a staggered array. The projections of the contact structures 202 and the contact plugs 109 on the substrate are partially intersected, so that the first sacrificial layers 104 and the second sacrificial layers 108 are at least partially exposed to facilitate the subsequent etching to form air gaps.

In this embodiment, the contact structure 202 may be made of a conductive material or may be made of multiple conductive materials, such as doped polysilicon, titanium, titanium nitride, tungsten and tungsten composites. In this embodiment, the contact structure 202 is made of tungsten which has low resistance, so that the transmission loss of the current may be further reduced.

In this embodiment, the width of the second air gap 204 is greater than the width of the first air gap 203. In some embodiments, the width of the second air gap 204 is 1 nm to 6 nm, such as 1 nm, 2 nm, 3 nm, 4 nm or 5 nm, and the width of the first air gap 203 is 0.1 nm to 5 nm, such as 0.5 nm, 1.0 nm, 1.5 nm, 2.0 nm, 2.5 nm, 3.0 nm, 3.5 nm, 4.0 nm or 4.5 nm.

In other embodiments, as shown in FIG. 28, a part of the first air gap is located at the bottom of the isolation layer, and the first air gap at the bottom of the isolation layer communicates with the second air gap.

In other embodiments, since the isolation layer is not included, the first air gap between the contact plug and the bit line structure communicates with the second air gaps.

This embodiment includes the first air gap on the sidewalls of the bit line structures and the second air gap on the sidewalls of the contact plug. Compared with the related technologies only forming a layer of air gap, by forming two layers of air gaps, the effect of reducing parasitic capacitance is better, and the formed air gaps are easy to seal.

Since the above embodiments and this embodiment correspond to each other, this embodiment may be implemented in cooperation with the above embodiments. The related technical details mentioned in the above embodiments are still valid in this embodiment, and the technical effects that can be achieved in the above embodiments can also be achieved in this embodiment. In order to reduce repetition, the details are not described here. Correspondingly, the related technical details mentioned in this embodiment may also be applied to the above embodiments.

A person of ordinary skill in the art can understand that the above embodiments are specific embodiments for implementing the present disclosure. In practical applications, various changes can be made in form and details without departing from the spirit and scope of the present disclosure.

The invention claimed is:

1. A forming method for a semiconductor structure, comprising:

providing a substrate, wherein bit line structures are formed on the substrate;

forming a first sacrificial layer on sidewalls of the bit line structures;

forming an isolation layer on a sidewall of the first sacrificial layer;

forming first dielectric layers filling gaps between the bit line structures;

patterning the first dielectric layers to form vias, wherein the vias expose active regions of the substrate, and the vias and remaining parts of the first dielectric layers are alternately arranged in an extension direction of the bit line structures;

forming a second sacrificial layer on sidewalls of the vias, and filling the vias to form contact plugs;

forming contact structures on the contact plugs; and removing the first sacrificial layer to form first air gaps, and removing the second sacrificial layer to form second air gaps; wherein the second air gaps surrounds the contact structures and the second air gaps are located on the substrate; and, wherein the first air gaps and the second air gaps are respectively located on two opposite sides of the isolation layer; and forming the first sacrificial layer on the sidewalls of the bit line structures and forming the isolation layer on the sidewall of the first sacrificial layer comprise:

forming a first sacrificial film on sidewalls of the bit line structures and a surface of the substrate;

forming an isolation film on the sidewall of the first sacrificial film and a surface of a part of the first sacrificial film on the surface of the substrate; and removing the part of the first sacrificial film on the surface of the substrate and a part of the isolation film on the surface of the substrate to form the isolation layer and the first sacrificial layer, wherein a part of the first sacrificial layer is located at a bottom of the isolation layers, wherein a part of the first air gaps is located at the bottom of the isolation layers, and the first air gaps communicate with the second air gaps.

2. The forming method of the semiconductor structure of claim 1, wherein after filling the vias to form the contact plugs and before forming the contact structures on the contact plugs, the method further comprises:
   removing the remaining parts of the first dielectric layers to form dielectric openings; and
   forming second dielectric layers filling the dielectric openings.

3. The forming method of the semiconductor structure of claim 1, wherein patterning the first dielectric layers to form the vias comprises:
   forming a first mask layer on the bit line structures and the first dielectric layers;
   patterning a part of the first mask layer on the first dielectric layers to form first etching openings, wherein remaining parts of the first mask layer and the first etching openings are alternately arranged in the extension direction of the bit line structures; and
   etching, by taking the remaining parts of the first mask layer as a mask, the first dielectric layers exposed by first etching openings to form the vias.

4. The forming method of the semiconductor structure of claim 3, wherein etching, by taking the remaining parts of the first mask layer as the mask, the first dielectric layers exposed by first etching openings to form the vias further comprises:
   etching a part of the substrate at a bottom of the first dielectric layers to form vias.

5. The forming method of the semiconductor structure of claim 1, wherein a thickness of the second sacrificial layer is greater than a thickness of the first sacrificial layer.

6. The forming method of the semiconductor structure of claim 1, wherein filling the vias to form the contact plugs comprises:
   forming a bottom conductive layer filling the vias; and
   etching a part of the bottom conductive layer to form the contact plugs, wherein a height of a surface of the contact plugs is lower than a height of a surface of the bit line structures.

7. The forming method of the semiconductor structure of claim 1, wherein after filling the vias to form the contact plugs and before forming the contact structures on the contact plugs, the method further comprises: forming an electrical connection layer on the contact plugs.

8. The forming method of the semiconductor structure of claim 1, further comprising:
   forming a barrier layer on sidewalls of the contact structures; and
   performing sealing process to the first air gaps and the second air gaps to form a sealing layer located on surfaces of the first air gaps and the second air gaps.

9. A forming method for a semiconductor structure, comprising:
   providing a substrate, wherein bit line structures are formed on the substrate;
   forming a first sacrificial layer on sidewalls of the bit line structures;
   forming first dielectric layers filling gaps between the bit line structures;
   patterning the first dielectric layers to form vias, wherein the vias expose active regions of the substrate, and the vias and remaining parts of the first dielectric layers are alternately arranged in an extension direction of the bit line structures;
   forming a second sacrificial layer on sidewalls of the vias, and filling the vias to form contact plugs;
   forming contact structures on the contact plugs; and
   removing the first sacrificial layer to form first air gaps, and removing the second sacrificial layer to form second air gaps; wherein the second air gaps surrounds the contact structures, the second air gaps are located on the substrate, the first air gaps are alternatively located between the second air gaps and the bit line structures, and between the first dielectric layers and the bit line structures.

* * * * *